(12) United States Patent
Shang

(10) Patent No.: US 10,049,762 B2
(45) Date of Patent: Aug. 14, 2018

(54) SHIFT REGISTER UNIT, OPERATION METHOD THEREFOR AND SHIFT REGISTER

(71) Applicant: BOE TECHNOLOGY GROUP CO., LTD., Beijing (CN)

(72) Inventor: Guangliang Shang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/532,343

(22) PCT Filed: Sep. 30, 2016

(86) PCT No.: PCT/CN2016/101107
§ 371 (c)(1),
(2) Date: Jun. 1, 2017

(87) PCT Pub. No.: WO2017/059791
PCT Pub. Date: Apr. 13, 2017

(65) Prior Publication Data
US 2017/0345515 A1  Nov. 30, 2017

(30) Foreign Application Priority Data
Oct. 9, 2015 (CN) .......................... 2015 1 0649786

(51) Int. Cl.
*G11C 19/18* (2006.01)
*G11C 19/28* (2006.01)
*G09G 3/20* (2006.01)

(52) U.S. Cl.
CPC ......... *G11C 19/186* (2013.01); *G09G 3/2096* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 2011/0058640 A1* | 3/2011 | Shang | G11C 19/184 377/64 |
| 2011/0228893 A1 | 9/2011 | Tobita et al. | |

(Continued)

FOREIGN PATENT DOCUMENTS

| | | |
|---|---|---|
| CN | 1993726 A | 7/2007 |
| CN | 102654982 A | 9/2012 |

(Continued)

OTHER PUBLICATIONS

International Search Report and Written Opinion dated Dec. 28, 2016; PCT/CN2016/101107.

(Continued)

*Primary Examiner* — Crystal L Hammond
(74) *Attorney, Agent, or Firm* — Ladas & Parry LLP; Loren K. Thompson

(57) ABSTRACT

Disclosed are a shift register unit, an operation method therefor and a shift register including the shift register unit. The shift register unit includes: an input module configured to transmit a received input signal to a pull-up node; an output module configured to output a first control signal of a first control signal end to an output end when a pull-up signal at the pull-up node is at an effective pull-up level; and a coupling module having a first end connected to a second control signal end and a second end connected to the pull-up node, and being configured to control the pull-up signal at the pull-up node in a voltage coupling manner according to a second control signal of the second control signal end. By further pulling up the voltage at the pull-up node when output end is reset, the speed of resetting the output end can be increased.

19 Claims, 14 Drawing Sheets

(56) References Cited

U.S. PATENT DOCUMENTS

| | | | |
|---|---|---|---|
| 2012/0293401 A1 | 11/2012 | Li et al. | |
| 2016/0232865 A1* | 8/2016 | Hao | G09G 3/3677 |
| 2016/0320681 A1* | 11/2016 | Kim | G02F 1/136204 |
| 2016/0372070 A1* | 12/2016 | Hu | G09G 3/3614 |
| 2017/0025068 A1* | 1/2017 | Jeoung | G11C 19/28 |
| 2017/0039969 A1* | 2/2017 | Wang | G09G 3/3648 |
| 2017/0046998 A1* | 2/2017 | Zhang | G09G 3/2092 |

FOREIGN PATENT DOCUMENTS

| | | |
|---|---|---|
| CN | 103632641 A | 3/2014 |
| CN | 104464645 A | 3/2015 |
| CN | 104616616 A | 5/2015 |
| CN | 104809973 A | 7/2015 |
| CN | 105161134 A | 12/2015 |
| CN | 204966057 U | 1/2016 |

OTHER PUBLICATIONS

The First Chinese Action dated Dec. 19, 2017; Appln. No. 201510649786.4.

* cited by examiner

SHIFT REGISTER UNIT, OPERATION METHOD THEREFOR AND SHIFT REGISTER

TECHNICAL FIELD

The present disclosure relates to a field of display, more particularly to a shift register unit and an operation method for the shift register unit, and a shift register comprising the shift register unit.

BACKGROUND

At present, in a circuit structure of the shift register unit, an output end of the shift register unit and a pull-up node are reset simultaneously by utilizing a special output reset transistor and a special node reset transistor. As shown in FIG. 1, gates of an output reset transistor T4 and a node reset transistor T2 of the shift register unit are connected with a reset input end, and the output end and the pull-up node are reset respectively under control of a reset signal input by a reset input end. In order to reduce reset time of the shift register unit, it requires enlarging an area of the output reset transistor T4, such that a turn-on voltage of the output reset transistor T4 is relatively small. However, it is apparent that enlarging the area of the reset transistor T4 is obviously not helpful to enhance resolution of a display device and narrow frame of the display device.

There has been set forth a solution of resetting the output end and the pull-up node of the shift register unit in a time division manner. As shown in FIG. 3, compared with FIG. 1, the output reset transistor T4 is no longer comprised, the gate of the node reset transistor T2 receives the reset signal, and when a clock signal CLK is switched from a high level to a low level, the pull-up node is at the high level, an output transistor T3 maintains turned on and resets the output end to low level of the clock signal CLK. Although the output reset transistor T4 is omitted in FIG. 3, the shift register unit as shown in FIG. 3 still cannot satisfy the requirement for products as the resolution of the display is further enhanced and the requirement for the narrow frame is further enhanced.

Therefore, it needs to propose a shift register unit, which is capable of not only reducing the area of the shift register unit but also reducing the reset time of the output end of the shift register unit.

SUMMARY

In order to solve the above technical problem, there is set forth a shift register unit and an operation method for the shift register unit, and a shift register comprising the shift register unit, which can reduce a reset time of the shift register unit without increasing an area of the shift register unit.

According to one aspect of the present disclosure, there is provided a shift register unit, comprising: an input module of which a first end is connected with an input end of the shift register unit and used to receive an input signal from the input end and a second end is connected with a pull-up node, and configured to transmit a received input signal to the pull-up node; an output module of which a first end is connected with the pull-up node, a second end is connected with a first control signal end, and a third end is connected with an output end of the shift register unit, and configured to output a first control signal of the first control signal end to the output end when a pull-up signal at the pull-up node is in effective pull-up level; a coupling module of which a first end is connected with a second control signal end and a second end is connected with the pull-up node, and configured to control the pull-up signal at the pull-up node according to a second control signal of the second control signal end by way of voltage coupling.

According to an embodiment of the present embodiment, the coupling module comprises: a first capacitor, whose first end is connected with the second control signal end and second end is connected with the pull-up node.

According to an embodiment of the present disclosure, the coupling module comprises: a coupling transistor, whose gate is connected with the second control signal end, first electrode is connected with a third control signal end; and a first capacitor, whose first end is connected with a second electrode of the coupling transistor and second end is connected with the pull-up node.

According to another aspect of the present disclosure, there is further provided an operation method for the shift register unit as described above, comprising: in the case of an output signal at the output end of the output module being at a high level, the coupling module raises the pull-up signal at the pull-up node from a first pull-up voltage to a second pull-up voltage by way of voltage coupling according to the second control signal of the second control signal end; and in the case of the first control signal of the first control signal end jumping from the high level to a low level, a pull-up signal of the second pull-up voltage at the pull-up node makes the output module pull down the output end to the low level of the first control signal, wherein the output module outputs the first control signal to the output end when the pull-up signal at the pull-up node is in the first pull-up voltage and the second pull-up voltage.

According to an embodiment of the present disclosure, the operation method comprises: in a first output phase, the first control signal of the first control signal end is at the high level, the output module transmits a high voltage of the first control signal to the output end, so that the output signal at the output end is at the high level, the output module raises the pull-up signal at the pull-up node from a first voltage to a second voltage by utilizing an output voltage of the output voltage by way of voltage coupling, and the second voltage is the first pull-up voltage; in a second output phase, the first control signal of the first control signal end is at the high level, the second control signal of the second control signal end is at the high level, the output end maintains at the high level, the coupling module raises the pull-up signal at the pull-up node from the second voltage to a third voltage by utilizing the high level of the second control signal by way of voltage coupling, and the third voltage is the second pull-up voltage; in a first reset phase, the first control signal of the first control signal end jumps from the high level to the low level, a pull-up signal of the third voltage at the pull-up node makes the output module pull down the output end to the low level of the first control signal, so that the output signal at the output end is at the low level, and the output module decreases the pull-up signal at the pull-up node from the third voltage to a fourth voltage by utilizing the output voltage of the output end by way of voltage coupling; in a second reset phase, the second control signal of the second control signal end jumps from the high level to the low level, and a fourth control signal of a fourth control signal end jumps from the low level to the high level, the coupling module makes the pull-up signal at the pull-up node decrease by utilizing the low level of the second control signal by way of voltage coupling, and the reset module pulls down the pull-up node to the low level of a low power supply voltage end.

According to an embodiment of the present disclosure, the operation method comprises: in a first output phase, the first control signal of the first control signal end is at the high level, the output signal at the output end is at the high level, the output module raises the pull-up signal at the pull-up node from the first voltage to the second voltage by utilizing the high level of the output end by way of voltage coupling, and the second voltage is the first pull-up voltage; in a second output phase, the first control signal of the first control signal end is at the high level, the second control signal of the second control signal end is at the high level, a third control signal of a third control signal end is at the low level, the output end maintains at the high level, and the pull-up node maintains the second voltage; in a third output phase, the first control signal of the first control signal end is at the high level, the second control signal of the second control signal end maintains the high level, the third control signal of the third control signal end jumps from the low level to the high level, the output end maintains at the high level, the coupling module raises the pull-up signal at the pull-up node from the second voltage to the third voltage by utilizing high level of the third control signal by way of voltage coupling, and the third voltage is the second pull-up voltage; in a first reset phase, the first control signal of the first control signal end jumps from the high level to the low level, the pull-up signal of the third voltage at the pull-up node makes the output module pull down the output end to the low level of the first control signal, such that the output signal at the output end is at the low level, and the output module decreases the pull-up signal at the pull-up node from the third voltage to the fourth voltage by utilizing the low level of the output end by way of voltage coupling; in a second reset phase, the third control signal of the third control signal end jumps from the high level to the low level, and the coupling module makes the pull-up signal at the pull-up node decrease from the fourth voltage to a fifth voltage by utilizing the low level of the third control signal by way of voltage coupling; in a third reset phase, the fourth control signal of the fourth control signal end jumps from the low level to the high level, and the reset module pulls down the pull-up node to low level of the low power supply voltage end.

According to another aspect of the present disclosure, there is provided a shift register, comprising multiple shift register units connected in cascades as described above, wherein input ends of first and second stages of shift register units receive an initial input signal, an input end of a (2j+1)-th stage of shift register unit is connected with an output end of a (2j−1)-th stage of shift register unit, and an input end of a (2j+2)-th stage of shift register unit is connected with an output end of a 2j-th stage of shift register unit, where j is an integer greater than or equal to 1; a first control signal end of a (4i+1)-th stage of shift register unit is connected with a first clock signal end, and a second control signal end thereof is connected with an output end of a (4i+2)-th stage of shift register unit, where i is an integer greater than or equal to 0; a first control signal end of the (4i+2)-th stage of shift register unit is connected with a second clock signal end, and a second control signal end thereof is connected with an output end of a (4i+3)-th stage of shift register unit; a first control signal end of the (4i+3)-th stage of shift register unit is connected with a third clock signal end, and a second control signal end thereof is connected with an output end of a (4i+4)-th stage of shift register unit; a first control signal end of the (4i+4)-th stage of shift register unit is connected with a fourth clock signal end, and a second control signal end thereof is connected with an output end of a (4i+5)-th stage of shift register unit.

According to an embodiment of the present disclosure, periods of a first clock signal at the first clock signal end, a second clock signal at the second clock signal end, a third clock signal at the third clock signal end, and a fourth clock signal at the fourth clock signal end are a first period, and the second clock signal is prolonged ¼ of the first period than the first clock signal, the third clock signal is prolonged ¼ of the first period than the second clock signal, and the fourth clock signal is prolonged ¼ of the first period than the third clock signal.

According to the embodiment of the present disclosure, the coupling module comprises: a first capacitor, whose first end is connected with the second control signal end and second end is connected with the pull-up node.

According to the embodiment of the present disclosure, the coupling module comprises: a coupling transistor, whose gate is connected with the second control signal end and first electrode is connected with the third control signal end; and the first capacitor, whose first end is connected with a second electrode of the coupling transistor, and second end is connected with the pull-up node. A third control signal end of the (2j−1)-th stage of shift register unit is connected with a first pulse signal end; a third control signal end of the 2j-th stage of shift register unit is connected with a second pulse signal end. Periods of a first pulse signal at the first pulse signal end and a second pulse signal at the second pulse signal end is a second period, and the second pulse signal is prolonged ½ of the second period than the first pulse signal, duty ratios of the first pulse signal and the second pulse signal are the same and smaller than or equal to ½, and the second period is ½ of the first period.

The shift register unit and the operation method for the shift register unit, and the shift register according to the embodiments of the present disclosure reset the output end and the pull-up node in a time division manner, and further pulls up the voltage of the pull-up node when the output end is reset, which could not only realize resetting of the shift register unit by utilizing the output transistor but also enhance speed of resetting the output end by the output transistor, so that the reset time of the shift register unit is reduced, which is advantageous to enhance resolution of the display device and narrow frame of the display device.

Other characteristics and advantages of the present disclosure will be described in the description below, and a part thereof is obvious from the specification, or is known through implementation of the present disclosure. Purposes and other advantages of the present disclosure can be realized and obtained by structures specially pointed out in the specification, Claims and figures.

BRIEF DESCRIPTION OF THE DRAWINGS

Embodiments of the present disclosure will be described in detail by combining with accompanying figures. The above and other purposes, characteristics and advantages of the present disclosure will become more evident. The figures are used to provide further understanding of the embodiments of the present disclosure, form a part of the specification, and are used to explain the present disclosure together with the embodiments of the present disclosure, but do not form limitation to the present disclosure. In the figures, same reference marks represent generally same means or steps.

DETAILED DESCRIPTION

In order to make purposes, technical solutions and advantages of embodiments of the present disclosure more evident, exemplary embodiments of the present disclosure will be described below in detail by referring to accompanying figures. Obviously, the exemplary embodiments described below are just a part of embodiments of the present disclosure, but not all the embodiments of the present disclosure. All of other embodiments obtained by those skilled in the art without paying any inventive labor shall fall into the protection scope of the present disclosure.

Herein, it needs to note that in the figures, same reference marks are given basically to components having same or similar structures and functions, and repeated descriptions relating thereto will be omitted.

Figure 1:
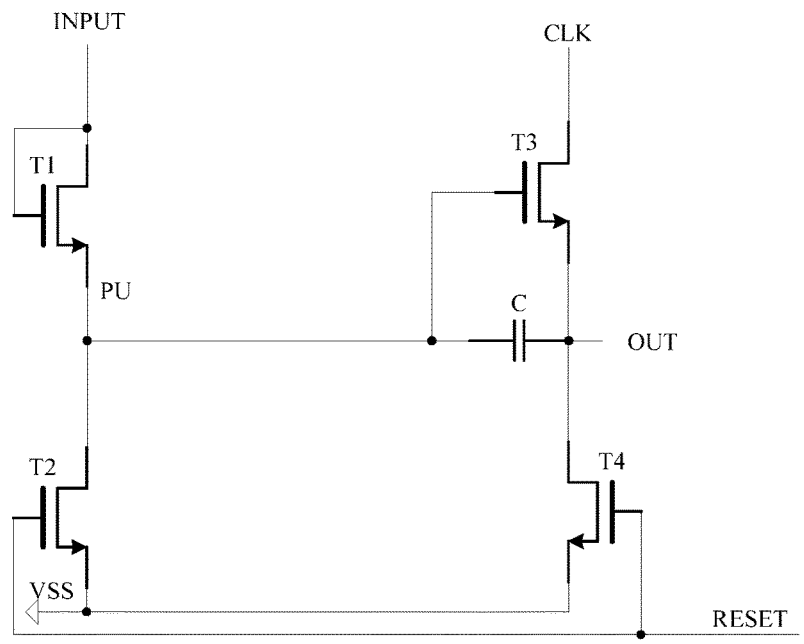
FIG. 1 shows a schematic diagram of a structure of a shift register unit in the prior art.

As shown in FIG. 1, it shows a schematic diagram of a structure of a shift register in the prior art. The shift register unit comprises an input transistor T1, an output transistor T3, a node reset transistor T2, an output reset transistor T4 and a capacitor C.

A gate and a drain of the input transistor T1 are connected with an input end INPUT, a source of the input transistor T1 is connected with a pull-up node PU, a gate of the output transistor T3 is connected with a pull-up transistor, a drain of the output transistor T3 is connected with a clock signal end, a source of the output transistor T3 is connected with an output end OUT, gates of the output reset transistor T4 and the node reset transistor T2 are connected with the reset end RESET, sources of the output reset transistor T4 and the node reset transistor T2 are connected with a low power supply voltage end VSS, a drain of the output reset transistor T4 is connected with the output end OUT, and a drain of the node reset transistor T2 is connected with the pull-up node PU, a first end of the capacitor C is connected with the pull-up node PU, and another end of the capacitor C is connected with the output end OUT.

Figure 2:
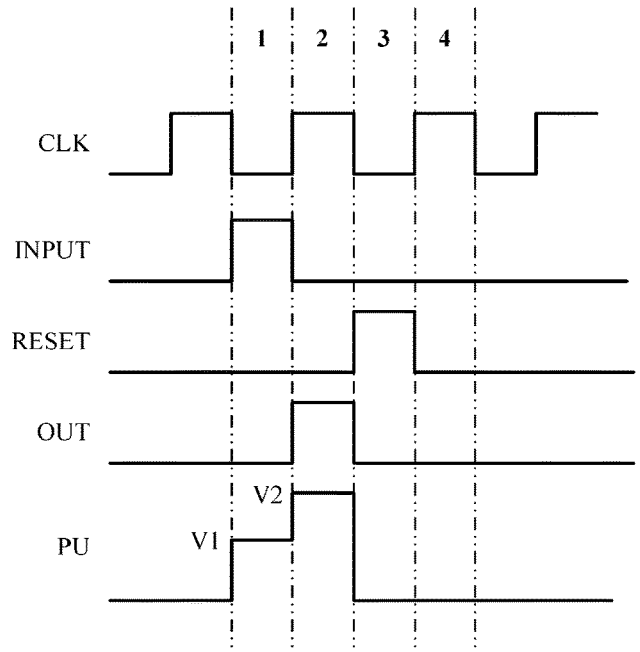
FIG. 2 shows a timing diagram of a shift register unit as shown in FIG. 1.

FIG. 2 shows a timing diagram of the shift register unit as shown in FIG. 1. As shown in FIG. 2, in a first phase 1, the input end INPUT is at a high level, the input transistor T1 is turned on to transmit the high level of the input end INPUT to the pull-up node PU. Now, the pull-up node PU is in a first voltage V1, such that the output transistor T3 is turned on, and since a clock signal at a clock signal end CLK is at a low level, the output end OUT outputs the low level; in a second phase 2, the input end INPUT is at the low level, the input transistor T1 is turned off, the reset end RESET is at the low level, the node reset transistor T2 and the output reset transistor T4 are turned off, the pull-up node PU continues to make the output transistor T3 turned on, the clock signal at the clock signal end CLK is at the high level, and the output end OUT outputs the high level, and due to the effect of voltage-coupling of the capacitor C, the pull-up node PU is raised from the first voltage V1 to a second voltage V2 at this time; in a third phase 3, the reset end RESET is at the high level, the node reset transistor T2 and the output reset transistor T4 are turned on, and the pull-up node PU and the output end OUT are pulled down to a low voltage of the low power supply voltage end VSS respectively.

In the operation process of the shift register unit as shown in FIGS. 1 and 2, the node reset transistor T2 and the output reset transistor T4 are utilized respectively to realize resetting of the pull-up node PU and the output end OUT, that is, resetting of the output end OUT is realized completely by the output reset transistor T4. In order to reduce the reset time of the output end OUT, the area of the output reset transistor T4 has to be enlarged, which is obviously not helpful to enhance the resolution of the display device and narrow the frame of the display device.

Figure 3:
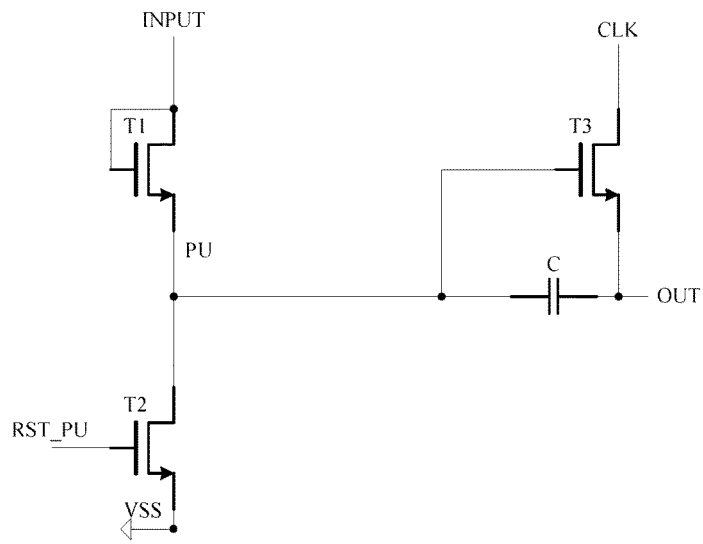
FIG. 3 shows a schematic diagram of a structure of another shift register unit in the prior art.

As shown in FIG. 3, it shows a schematic diagram of a structure of another shift register unit in the prior art. The shift register unit comprises an input transistor T1, an output transistor T3, a node reset transistor T2, and a capacitor C. A gate of the node reset transistor T2 is connected with a node reset end RST PU. Besides, connection manners of the input transistor T1, the output transistor T3, the node reset transistor T2 and the capacitor C are the same as those in FIG. 1, and thus no further description is given herein.

Figure 4:
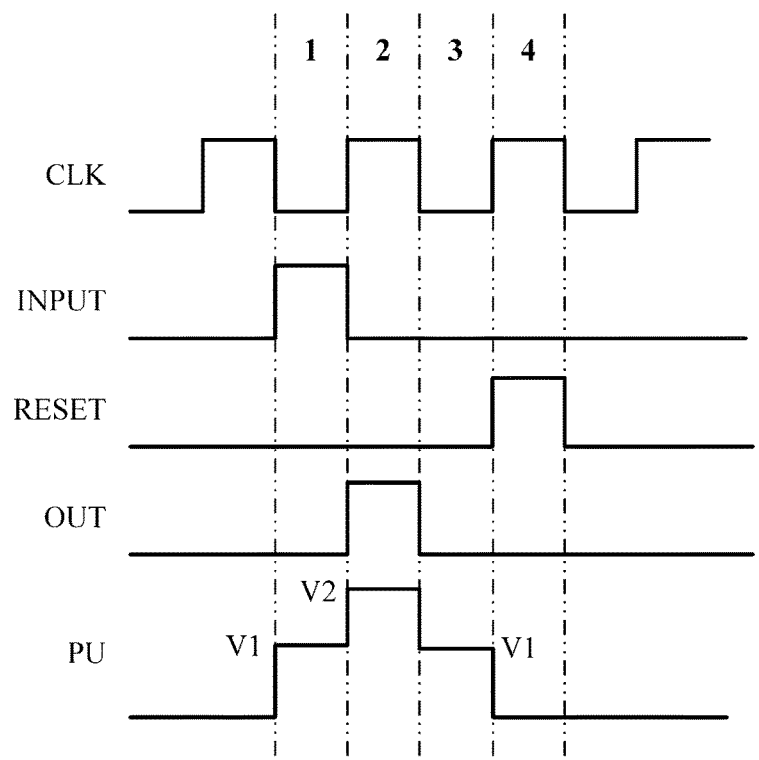
FIG. 4 shows a timing diagram of the shift register unit as shown in FIG. 3.

FIG. 4 shows a timing diagram of the shift register unit as shown in FIG. 3. As shown in FIG. 4, the operations of the shift register unit in the first phase 1 and the second phase 2 are the same as the operations as shown in FIG. 2, and thus no further description is given herein; in a third phase 3, the clock signal end CLK is at the low level, the pull-up node PU makes the output transistor T3 maintain turned on, the output end OUT is pulled down to the low level of the clock signal end CLK, and at this time the pull-up node PU is in the first voltage V1; then, in a fourth phase 4, the node reset end RST PU is at the high level, the node reset transistor 12 is turned on, and the pull-up node PU is pulled down to the low voltage of the low power supply voltage end VSS.

In the operation process of the shift register unit as shown in FIGS. 3 and 4, firstly, the pull-up node PU maintains not reset and at the same time the output transistor T3 is utilized to pull down the output end OUT, and the pull-up node PU is controlled to be pulled down by the reset signal after the output end OUT is pulled down. Although the high level of the pull-up node PU is utilized, the shift register unit as shown in FIG. 3 still cannot satisfy the requirements for further enhancing the resolution of the display device (for example, reaching UHD and a level higher than the UHD) and further narrowing the frame of the display device.

Figure 5:
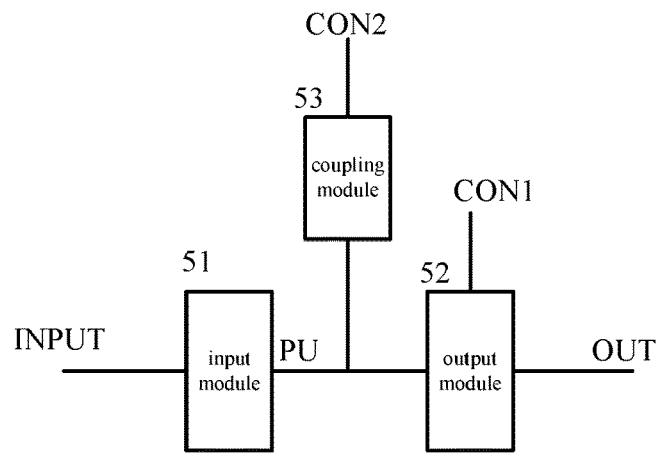
FIG. 5 shows a schematic block diagram of a shift register unit according to an embodiment of the present disclosure.

FIG. 5 shows a schematic block diagram of a shift register unit according to an embodiment of the present disclosure.

The shift register unit according to the embodiment of the present disclosure as shown in FIG. 5 comprises: an input module 51, an output module 52, and a coupling module 53.

A first end of the input module 51 is connected with an input end INPUT of the shift register unit and used to receive an input signal from the input end, and a second end thereof is connected with a pull-up node PU. The input module 51 is configured to transmit a received input signal to the pull-up node PU.

A first end of the output module 52 is connected with the pull-up node PU, a second end thereof is connected with a first control signal end CON1, and a third end thereof is connected with an output end OUT of the shift register unit. The output module 52 is configured to output a first control signal of the first control signal end CON1 to the output end OUT when a pull-up signal at the pull-up node PU is in effective pull-up level.

A first end of the coupling module 53 is connected with a second control signal end CON2, a second end thereof is connected with the pull-up node PU. The coupling module 53 is configured to control the pull-up signal at the pull-up node PU according to a second control signal of the second control signal end CON2 by way of voltage coupling.

When the shift register is operated, for example, in the case of an output signal at the output end of the output module 52 being at the high level, the coupling module 53 raises the pull-up signal at the pull-up node from a first pull-up voltage to a second pull-up voltage by way of voltage coupling according to the second control signal of the second control signal end CON2; and when the first control signal of the first control signal end CON1 jumps from the high level to the low level, a pull-up signal of a second pull-up voltage at the pull-up node makes the output module pull down the output end to the low level of the first control signal.

According to a first embodiment of the present disclosure, the coupling module 53 is configured to utilize the second control signal of the second control signal end CON2 to perform voltage-coupling to control the pull-up signal at the pull-up node PU. Specifically, when the second control signal of the second control signal end CON2 jumps from a first level to a second level, the coupling module 53 make the pull-up signal at the pull-up node PU also have a voltage jump by way of voltage coupling, i.e., jumping from a first coupling voltage to a second coupling voltage. For example, when the second control signal of the second control signal end CON2 jumps from the low level to the high level, the coupling module 53 raises the pull-up signal at the pull-up node PU from a voltage VA to a voltage VB by way of voltage coupling. Or, when the second control signal of the second control signal end CON2 jumps from the high level to the low level, the coupling module 53 decreases the pull-up signal at the pull-up node PU from the voltage VC to the voltage CD by way of voltage coupling.

The first control signal of the first control signal end CON1, the second control signal of the second control signal end CON2, and the output signal at the output end OUT are different from each other. A period of the first control signal is a first period, and the second control signal is prolonged ¼ of the first period than the output signal.

Through the shift register unit according to the embodiment of the present disclosure, in the cause of the output signal at the output end of the output unit OUT being at the high level, the coupling module raises the pull-up signal at the pull-up node from the first pull-up voltage to the second pull-up voltage by way of voltage coupling according to the second control signal of the second control signal end CON2, and then when the first control signal of the first control signal end CON1 jumps from the high level to the low level, the pull-up node PU being at the second pull-up voltage makes the output module pull down the output end to the low level of the first control signal. The output module outputs the first control signal to the output end when the pull-up signal at the pull-up node is in the first pull-up voltage and the second pull-up voltage.

Figure 6A:
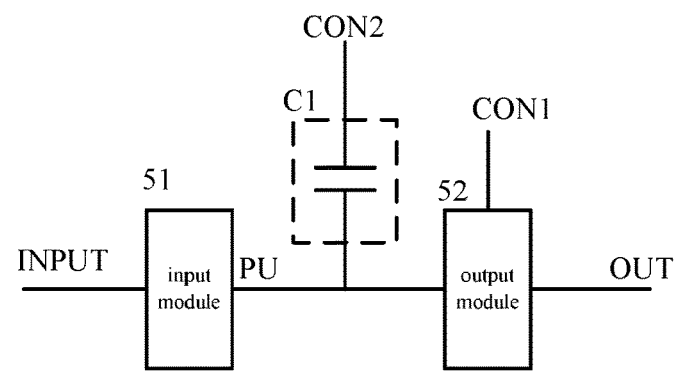
FIG. 6A is an exemplary implementation of a coupling module of a shift register unit according to a first embodiment of the present disclosure.

FIG. 6A shows an exemplary implementation of the coupling module 53 of the shift register unit according to the first embodiment of the present disclosure.

As shown in FIG. 6A, the coupling module 53 comprises a first capacitor C1, whose first end is connected with the second control signal end CON2 and second end is connected with the pull-up node PU.

According to the second embodiment of the present disclosure, the coupling module 53 further comprises a third end, and the third end is connected with the third control signal end CON3. And the coupling module 53 is configured to: control the pull-up signal at the pull-up node PU by utilizing the third control signal of the third control signal end CON3 to perform voltage-coupling when the second control signal of the second control signal end CON2 is in effective control level. Specifically, when the second control signal of the second control signal end CON2 is in effective control level and when the third control signal of the third control signal end CON3 jumps from the first level to the second level, the coupling module 53 makes the pull-up signal at the pull-up node PU to have voltage jump by way of voltage-coupling, i.e., jumping from the first coupling voltage to the second coupling voltage. For example, when the second control signal of the second control signal end CON2 is in effective control level and when the third control signal of the third control signal end CON3 jumps from the low level to the high level, the coupling module 53 raises the pull-up signal at the pull-up node PU from the voltage VA to the voltage VB by way of voltage coupling. Or, when the second control signal of the second control signal end CON2 is in effective control level and when the third control signal of the third control signal end CON3 jumps from the high level to the low level, the coupling module 53 decreases the pull-up signal at the pull-up node PU from the voltage VC to the voltage VD by way of voltage coupling.

The first control signal of the first control signal end CON1, the second control signal of the second control signal end CON2, the third control signal of the third control signal end CON3, and the output signal at the output end OUT are different from each other. The period of the first control signal is the first period, the period of the third control signal is the second period, the second period is ½ of the first period, the second control signal is prolonged ¼ of the first period than the output signal, the duty ratio of the third control signal is smaller than or equal to ½, and the third control signal is in effective control level at both a jump-up edge and a jump-down edge of the first control signal.

Figure 6B:
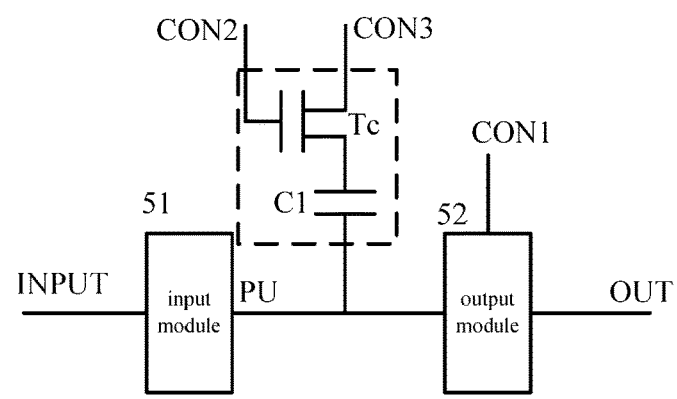
FIG. 6B shows an exemplary implementation of a coupling module 53 of a shift register unit according to a second embodiment of the present disclosure.

FIG. 6B shows an exemplary implementation of the coupling module 53 of the shift register unit according to the second embodiment of the present disclosure.

As shown in FIG. 6B, the coupling module 53 comprises a coupling transistor Tc and the first capacitor C1.

A gate of the coupling transistor Tc is connected with the second control signal end CON2, and a first electrode thereof is connected with the third control signal end CON3. The first end of the first capacitor C1 is connected with a second electrode of the coupling transistor Tc, and the second end thereof is connected with the pull-up node PU.

Alternatively, the gate of the coupling transistor Tc can be connected with the third control signal end CON3, and the first electrode thereof can be connected with the second control signal end CON2.

Figure 7A:
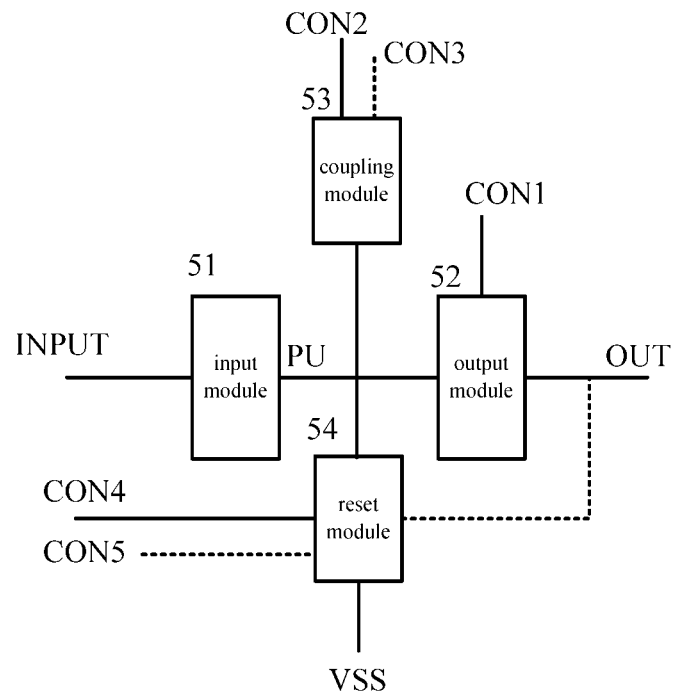
FIG. 7A shows another schematic block diagram of a shift register unit according to an embodiment of the present disclosure.

FIG. 7A shows another schematic block diagram of a shift register unit according to an embodiment of the present disclosure.

Besides including the input module 51, the output module 52, and the coupling module 53 as shown in FIG. 5, the shift register unit according to the embodiment of the present disclosure as shown in FIG. 7A further comprises: a reset module 54.

A first end of the reset module 54 is connected with a fourth control signal end CON4, a second end thereof is connected with the pull-up node PU, and a third end thereof is connected with the low power supply voltage end VSS, and the reset module 54 is configured to pull down the pull-up signal at the pull-up node PU to the low power supply voltage of the low power supply voltage end VSS when a fourth control signal of the fourth control signal end CON4 is in effective control level. For example, the fourth control signal of the fourth control signal end CON4 is prolonged ¾ of the first period than the output signal at the output end.

Optionally, the reset module 54 further comprises a fourth end and a fifth end. The fourth end is connected with a fifth control signal end CON5, and the fifth end is connected with the output end OUT, and the reset module 54 is further configured to pull down the output signal at the output end OUT to the low power supply voltage of the low power supply voltage end VSS when a fifth control signal of the fifth control signal end CON5 is in effective control level. For example, the fifth control signal of the fifth control signal end CON5 is prolonged ½ of the first period than the output signal at the output end OUT.

Figure 7B:
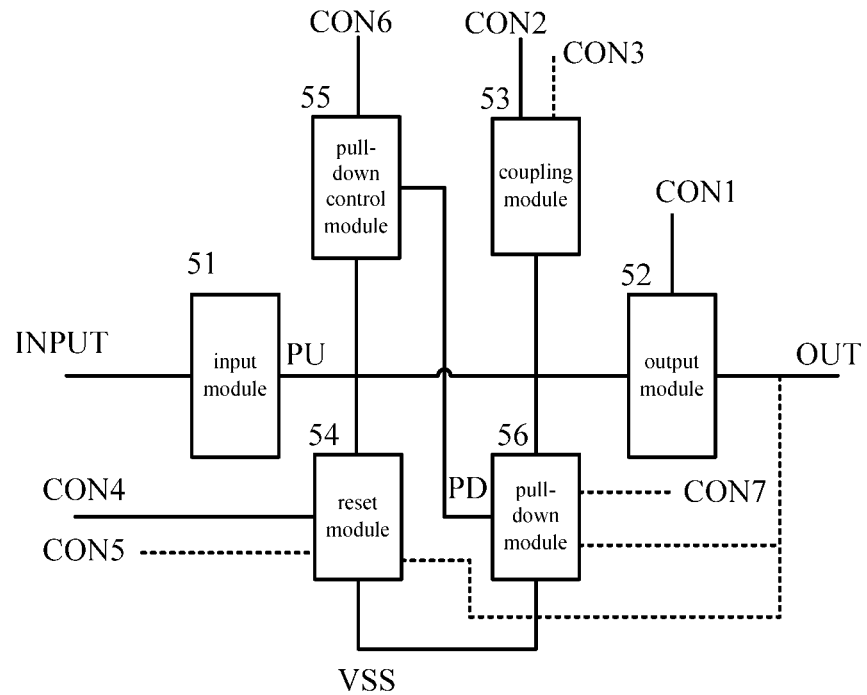
FIG. 7B shows another schematic block diagram of a shift register unit according to an embodiment of the present disclosure.

FIG. 7B shows yet another schematic block diagram of the shift register unit according to the embodiment of the present disclosure.

Besides including the input module 51, the output module 52 and the coupling module 53 and the reset module 54 as shown in FIG. 7A, the shift register unit according to the embodiment of the present disclosure as shown in FIG. 7B further comprises a pull-down control module 55 and a pull-down module 56.

A first end of the pull-down control module 55 is connected with a sixth control signal end CON6, a second end thereof is connected with the pull-up node PU, and a third end thereof is connected with the pull-down node PD. The pull-down control module 55 is configured: to generate, at the pull-down node PD, a pull-down signal which is in ineffective pull-down level when the pull-up signal at the pull-up node PU is in effective pull-up level, and to generate, at the pull-down node PD, a pull-down signal which is in effective pull-down level when the pull-up signal at the pull-up node PU is in ineffective pull-up level and a sixth control signal of the sixth control signal end CON6 is in effective control level. For example, the sixth control signal of the sixth control signal end CON6 is prolonged ¾ of the first period than the first control signal of the first control signal end CON1.

A first end of the pull-down module 56 is connected with the pull-down node PD, a second end thereof is connected with the output end OUT, a third end thereof is connected with the pull-up node PU, and a fourth end thereof is connected with the low power supply voltage end VSS, and the pull-down module is configured to pull down the output end OUT and the pull-up node PU to the low power supply voltage of the low power supply voltage end VSS when the pull-down signal at the pull-down node PD is in effective pull-down level.

Optionally, the pull-down module 56 further comprises a fifth end, which is connected with a seventh control signal end CON7, and the pull-down module 56 is further configured to pull down the output end OUT to the low power supply voltage of the low power supply voltage end VSS when the seventh control signal of the seventh control signal end CON7 is in effective control level. For example, the seventh control signal of the seventh control signal end CON7 is prolonged ½ of the first period than the first control signal of the first control signal end CON1.

Operation of the shift register unit according to the first embodiment of the present disclosure will be described below by referring to FIGS. 8-12.

Figure 8:
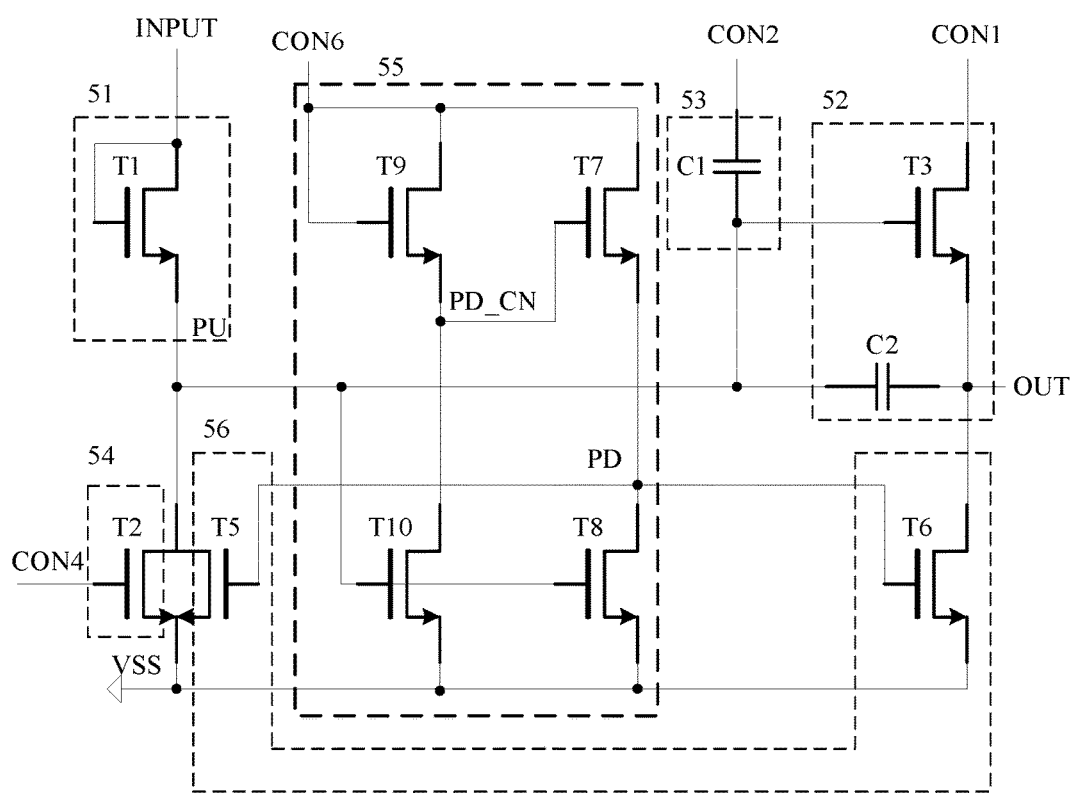
FIG. 8 shows an exemplary circuit implementation of the shift register unit according to the first embodiment of the present disclosure.

FIG. 8 shows an exemplary circuit implementation of the shift register unit according to the first embodiment of the present disclosure.

As shown in FIG. 8, the shift register unit according to the first embodiment of the present disclosure comprises the input module 51, the output module 52, the coupling module 53, the reset module 54, the pull-down control module 55 and the pull-up module 56.

The input module 51 comprises an input transistor T1, whose gate and first electrode are connected with the input end INPUT and second electrode is connected with the pull-up node PU. When the input signal at the input end INPUT is in effective input level, the input transistor T1 transmits the input signal at the input end INPUT to the pull-up node PU.

The output module 52 comprises an output transistor T3 and a second capacitor C2. A gate of the output transistor T3 and the first end of the second capacitor C2 are connected with the pull-up node PU, a first electrode of the output transistor T3 is connected with the first control signal end CON1, and a second electrode of the output transistor T3 and the second end of the second capacitor C2 are connected with the output end OUT. When the pull-up signal at the pull-up node PU is in effective pull-up level. the output transistor T3 is turned on to output the first control signal of the first control signal end CON1 to the output end OUT.

The coupling module 53 comprises a first capacitor C1, whose first end is connected with the second control signal CON2, and second end is connected with the pull-up node PU. For example, when the second control signal of the second control signal end CON2 jumps from the low level to the high level, the first capacitor C1 raises the pull-up signal at the pull-up node PU from the voltage VA to the voltage VB by way of voltage coupling; when the second control signal of the second control signal end CON2 jumps from the high level to the low level, the second capacitor C2 decreases the pull-up signal at the pull-up node PU from the voltage VC to the voltage VD by way of voltage coupling.

The reset module 54 comprises a node reset transistor T2, whose gate is connected with the fourth control signal end CON4, first electrode is connected with the pull-up node PU, and second electrode is connected with the low power supply voltage end VSS. When the fourth control signal of the fourth control signal end CON4 is in effective control level, the node reset transistor T2 is turned on to pull down the pull-up signal at the pull-up node PU to the low power supply voltage of the low power supply voltage end VSS.

The pull-down control module 55 comprises a first pull-down control transistor T9, a second pull-down control transistor T10, a third pull-down control transistor T7 and a fourth pull-down control transistor T8. A gate and a first electrode of the first pull-down control transistor T9 are connected with the sixth control signal end CON6, and a second electrode thereof is connected with a pull-down control node PD_CN; a gate of the second pull-down control transistor T10 is connected with the pull-up node PU, a first electrode thereof is connected with a pull-down control node PD_CN, and a second electrode thereof is connected with the low power supply voltage end VSS; a gate of the third pull-down control transistor T7 is connected with the pull-down control node PD_CN, a first electrode thereof is connected with the sixth control signal end CON6, and second electrode thereof is connected with the pull-down node PD; a gate of the fourth pull-down control transistor T8 is connected with the pull-up node PU, a first electrode thereof is connected with the pull-down node PD, and a second electrode thereof is connected with the low power supply voltage end VSS.

The pull-down module 56 comprises a node pull-down transistor T5 and an output pull-down transistor T6. Gates of the node pull-down transistor T5 and the output pull-down transistor T6 are connected with the pull-down node PD, second electrodes of the node pull-down transistor T5 and the output pull-down transistor T6 are connected with the low power supply voltage end VSS, a first electrode of the node pull-down transistor T5 is connected with the pull-up node PU, and a first electrode of the output pull-down transistor T6 is connected with the output end OUT. When the fourth control signal of the fourth control signal end CON4 is in effective pull-down level, the node pull-down transistor T5 and the output pull-down transistor T6 are turned on to pull down the pull-up node PU and the output end OUT to the low power supply voltage of the low power supply voltage end VSS.

For example, the first control signal end CON1 is connected with the first clock signal end, the first control signal is the first clock signal, and the period of the first clock signal is the first period. The second control signal of the second control signal end CON1 is prolonged ¼ of the first period than the output signal at the output end OUT. The fourth control signal of the fourth control signal end CON4 is prolonged ¾ of the first period than the output signal at the output end. The sixth control signal of the sixth control signal end CON6 lags ¾ of the first period than the first control signal of the first control signal end CON1.

Figure 9:
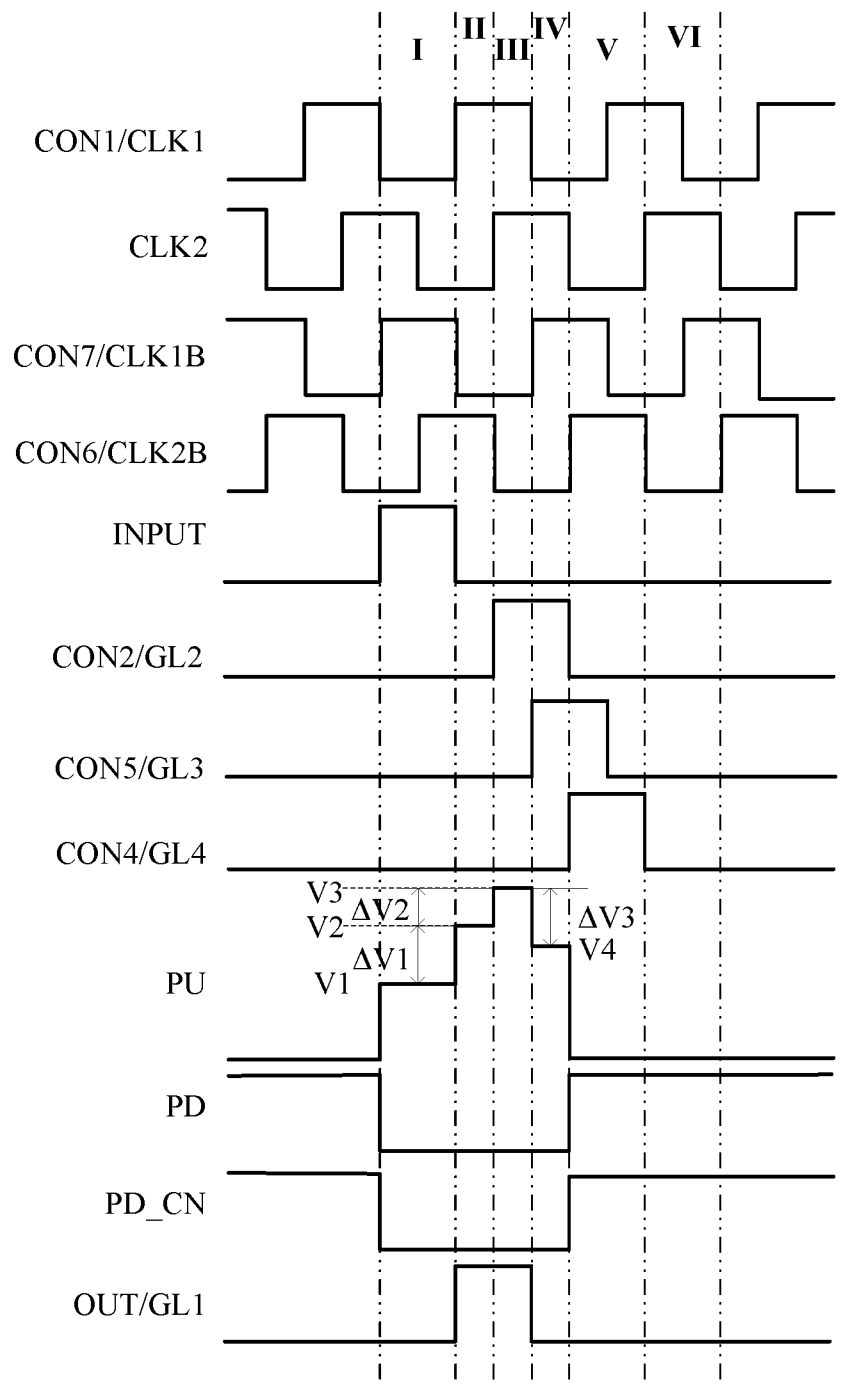
FIG. 9 shows an operation timing diagram of an exemplary circuit of the shift register unit according to the first embodiment of the present disclosure.

FIG. 9 shows an operation timing diagram of an exemplary circuit of the shift register unit according to the first embodiment of the present disclosure.

In a first phase I (input phase), the input end INPUT is at a high level, the input transistor T1 is turned on to transmit the high level of the input end INPUT to the pull-up node. At this time, the pull-up node is in a first high voltage V1, such that the output transistor 13 is turned on. Since the first control signal (i.e., first clock signal) of the first control signal end CON1 (i.e., first clock signal end CLK1) is at the low level, the output end OUT outputs the low level. In addition, in this phase. since the pull-up node PU is at the high level, the second pull-down control transistor T10 and the fourth pull-down control transistor 18 are turned on, such that the pull-down node PD is at the low level, and correspondingly the node pull-down transistor 15 and the output pull-down transistor T6 are turned off. Additionally, in this phase, the fourth control signal of the fourth control signal end CON4 is at the low level, and the reset node transistor T2 is turned off.

In a second phase II (first output phase), the input end INPUT is at the low level, the input transistor T1 is turned off, the fourth control signal end CON4 is at the low level, the node reset transistor T2 maintains turned off, the pull-up node PU continues to make the output transistor T3 turned on, the first control signal of the first control signal end CON1 is at the high level, the output end OUT outputs the high level, and due to the effect of voltage-coupling of the second capacitor C2, the pull-up node PU is raises from the first high voltage V1 to the second high voltage V2 at this time. Additionally, in this phase, since the pull-up node PU is still at the high level, the second pull-down control transistor T10 and the fourth pull-down control transistor T8 maintain turned on, the pull-down node PD is still at the low level, and correspondingly both the node pull-down transistor 15 and the output pull-down transistor T6 maintained turned off.

In a third phase III (second output phase), the input end INPUT is at the low level, the input transistor T1 maintains turned off, the fourth control signal CON4 is at the low level, the node reset transistor 12 maintains turned off, the second control signal of the second control signal end CON2 is at the high level, and due to the effect of the voltage-coupling of the first capacitor C1, the pull-up node PU is raised from the second high voltage V2 to the third high voltage V3 at this time. Additionally, in this phase, since the pull-up node PU is still at the high level, the second pull-down control transistor T10 and the fourth pull-down control transistor T8 maintains turned off, the pull-down node PD is still at the low level, and correspondingly both the node pull-down transistor 15 and the output pull-down transistor T6 maintains turned off.

In a fourth phase IV (first reset phase), the input end INPUT is at low level, the input transistor T1 maintains turned off, the fourth control signal end is at the low level, the node reset transistor T2 maintains turned off the second control signal of the second control signal end CON2 is still at the high level, the first control signal of the first control signal end CON1 jumps from the high level to the low level, and since the pull-up node PU is stills at the high level, the output transistor T3 is made to maintain turned off to pull down the output end OUT to the low level of the first control signal. Due to the effect of voltage-coupling of the second capacitor C2, the pull-up node PU decreases from the third high voltage V3 to the fourth high voltage V4 at this time. Additionally, in this phase, since the pull-up node PU is still at the high level, the second pull-down control transistor T10 and the fourth pull-down control transistor T8 maintain turned on, the pull-down node PD is still at the low level, and correspondingly both the node pull-down transistor T5 and the output pull-down transistor T6 maintains turned off.

In a fifth phase V (second reset phase), on one hand, the second control signal of the second control signal end CON2 jumps from the high level to the low level, due to the effect of voltage-coupling of the first capacitor C1, the pull-up node PU starts to decrease from the fourth high voltage V4 (for example, decreasing to the first high voltage V1). On the other hand, the fourth control signal of the fourth control signal end CON4 is at the high level, the node reset transistor T2 is turned on to pull down the pull-up node PU to the low voltage of the low power supply voltage end VSS. Additionally, in this phase, since the pull-up node PU is at the low level, both the second pull-down control transistor T10 and the fourth pull-down control transistor T8 are turned off. Since the sixth control signal of the sixth control signal end CON6 are at the high level, both the first pull-down control transistor T9 and the third pull-down control transistor T7 are turned on, such that the pull-down node PD jumps from the low level to the high level, and correspondingly both the node pull-down transistor T5 and the output pull-down transistor T6 are turned on to pull down the pull-up node PU and the output end OUT to the low power supply voltage of the low power supply voltage end VSS.

In a sixth phase VI since the sixth control signal of the sixth control signal end CON6 is at the low level, both the first pull-down control transistor T9 and the third pull-down control transistor 17 are turned off. Since the pull-up node PU is at the low level, both the second pull-down control transistor T10 and the fourth pull-down control transistor 18 maintain turned off, the pull-down node PD maintains at the high level, and correspondingly both the node pull-down transistor T5 and the output pull-down transistor T6 are turned on to pull down the pull-up node PU and the output end OUT to the low power supply voltage of the low power supply voltage end VSS.

After that, during display of one frame image, the fifth phase V and the sixth phase V1 are repeated until display of a next frame image starts, that is, the input end INPUT is again input an effective input signal.

A voltage difference between the second high voltage V2 and the first high voltage V1 is Δ V1, a voltage difference between the third high voltage V3 and the second high voltage V2 is Δ V2, and a voltage difference between the fourth high voltage V4 and the third high voltage V3 is Δ V3. The first high voltage, the second high voltage, the third high voltage, and the fourth high voltage are determined by a voltage value of the input signal at the input end INPUT, a voltage value of the first control signal of the first control signal end CON1, a voltage value of the second control signal of the second control signal end CON2, the first capacitor C1, the second capacitor C2 and a circuit parasitic capacitor.

As shown in FIG. 9, when the output end OUT starts pulled down, the pull-up signal at the pull-up node PU is in the third high voltage V3, and the third high voltage V3 is higher than the second high voltage V2 as shown in FIGS. 2 and 4. Therefore, the shift register unit according to the first embodiment of the present disclosure is capable of not only utilizing the output transistor T3 to realize resetting or pulling down of the output end OUT but also reducing the reset time of the output end OUT by further raising the pull-up signal at the pull-up node PU, which is helpful to enhance resolution of the display device and narrow the frame of the display device.

Figure 10:
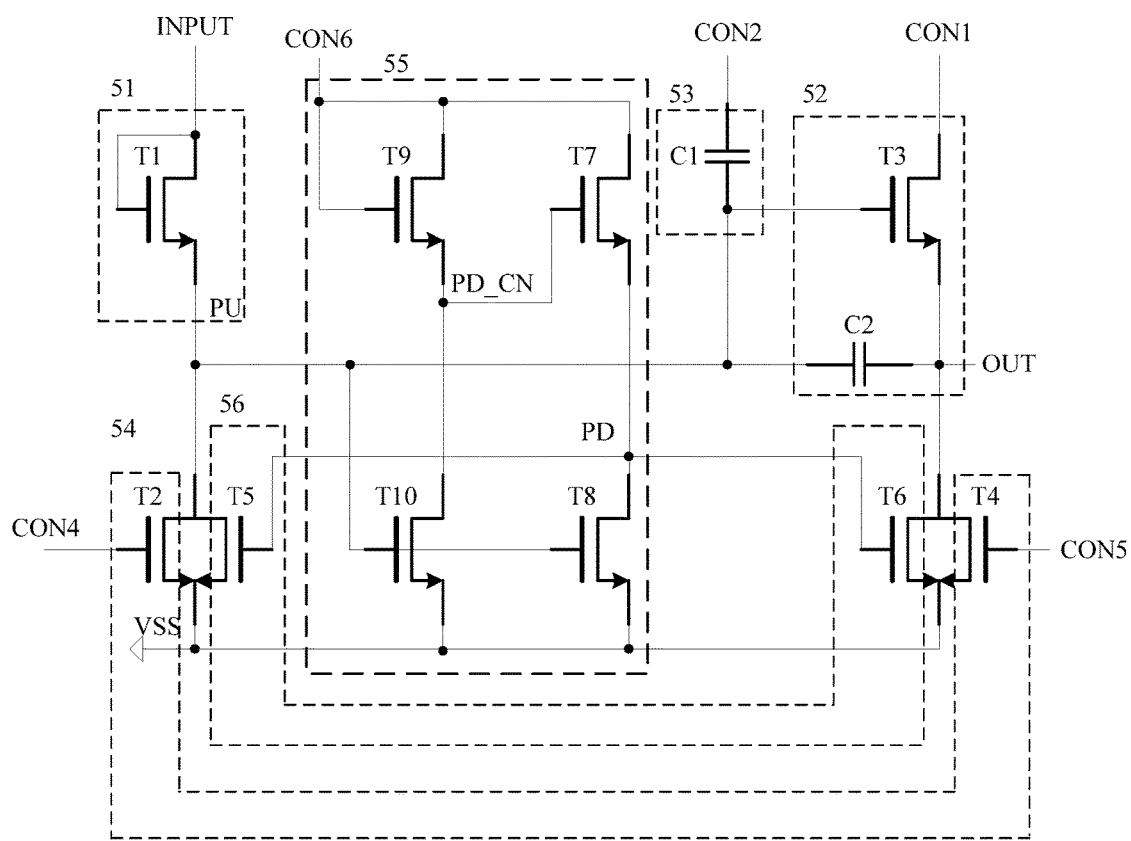
FIG. 10 shows another exemplary circuit implementation of the shift register unit according to the first embodiment of the present disclosure.

FIG. 10 shows another exemplary circuit implementation of the shift register unit according to the first embodiment of the present disclosure.

As shown in FIG. 10, the reset module 54 further comprises the output reset transistor T4, whose gate is connected with the fifth control signal end CON5, first electrode is connected with the output end OUT, and the second electrode is connected with the low power supply voltage end VSS. For example, the fifth control signal of the fifth control signal end CON5 is prolonged ½ of the first period than the output signal at the output end OUT.

In the fourth phase IV, the fifth control signal of the fifth control signal end CON5 is at the high level, and the output reset transistor T4 is turned on to pull down the output end OUT to the low power supply voltage of the low power supply voltage end VSS.

Driving capacity of the output end OUT can be enhanced by adding the output reset transistor T4. The output end OUT can be pulled down to the low power supply voltage of the low power supply voltage end VSS more quickly by the cooperation of the output transistor T3 and the output reset transistor T4.

Figure 11:
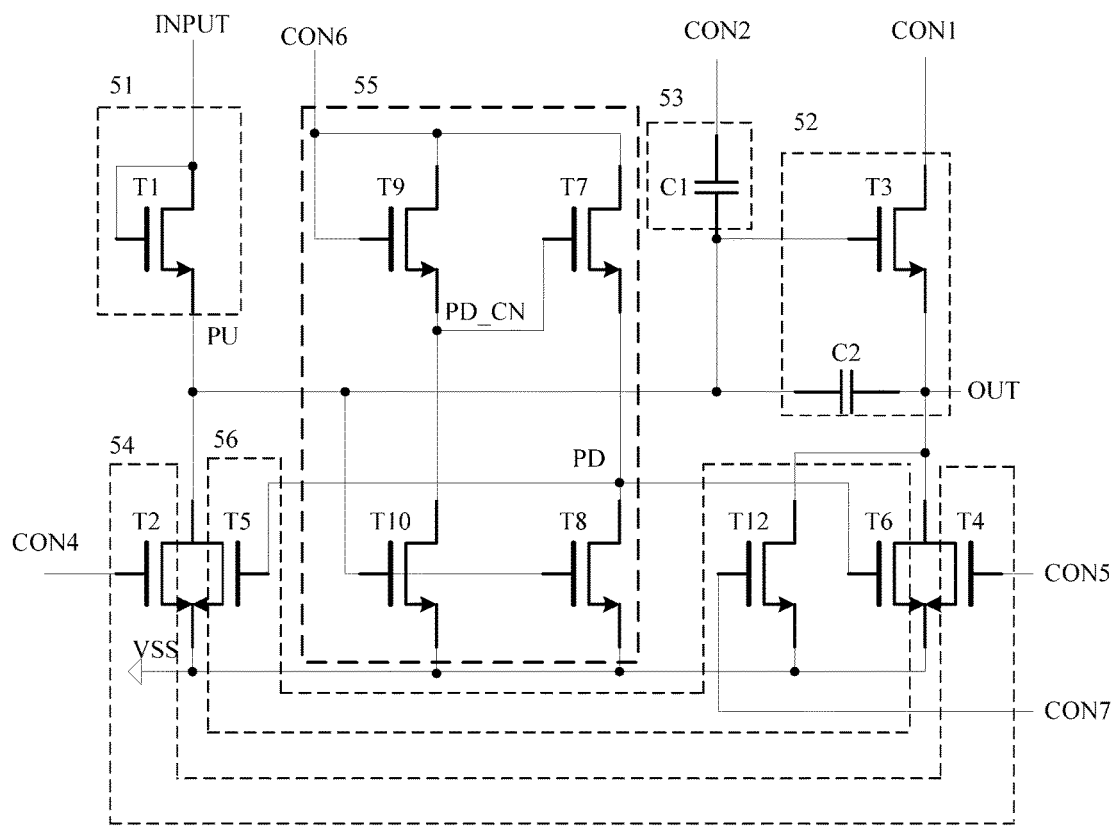
FIG. 11 shows yet another exemplary circuit implementation of the shift register unit according to the first embodiment of the present disclosure.

FIG. 11 shows yet another exemplary circuit implementation of the shift register unit according to the first embodiment of the present disclosure.

As shown in FIG. 11, the pull-down module 56 further comprises a clock pull-down transistor T11, whose gate is connected with the seventh control signal end CON7, first electrode is connected with the output end OUT, and second electrode is connected with the low power supply voltage end VSS. For example, the seventh control signal of the seventh control signal end CON7 is prolonged ½ of the first period than the first clock signal.

In the fourth phase IV, the seventh control signal of the seventh control signal end CON7 is at the high level, the clock pull-down transistor T11 is turned on to pull down the output end OUT to the low power supply voltage of the low power supply voltage end VSS.

Driving capacity of the output end OUT can be enhanced by adding the clock pull-down transistor T11, and the output end OUT can be pulled down to the low power supply voltage of the low power supply voltage end VSS faster through the cooperation of the output transistor T3 and the clock pull-down transistor T11.

Figure 12:
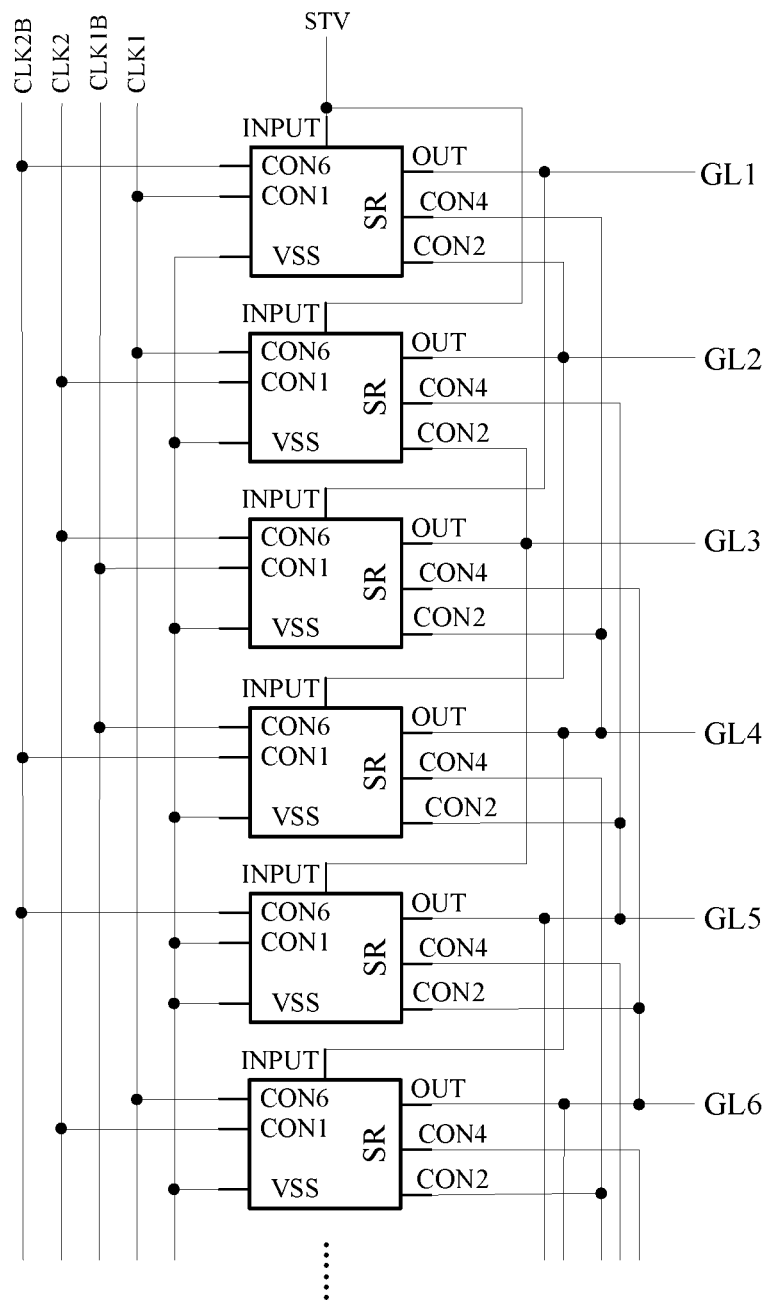
FIG. 12 shows a schematic block diagram of the shift register unit according to the first embodiment of the present disclosure.

FIG. 12 shows a schematic block diagram of the shift register unit according to the first embodiment of the present disclosure.

As shown in FIG. 12. the shift register according to the first embodiment of the present disclosure comprises a plurality of shift register units connected in cascades, each of which can be as shown in FIG. 8.

The shift register unit according to the first embodiment of the present disclosure is connected with a start input signal end STV, a first clock signal end CLK1, a second clock signal end CLK2, a third clock signal end CLK1B and a fourth clock signal end CLK2B. Periods of a first clock signal at the first clock signal end CLK1, a second clock signal at the second clock signal end CLK2, a third clock signal at the third clock signal end and a fourth clock signal at the fourth clock signal end CLK2B are the first period, and the second clock signal is prolonged ¼ of the first period than the first clock signal, the third clock signal is prolonged ¼ of the first period than the second clock signal, and the fourth clock signal is prolonged ¼ of the first period than the third clock signal.

Input ends INPUT of first and second stages of shift register units are connected with an initial input signal end STV to receive an initial input signal, an input end of a (2j+1)-th stage of shift register unit is connected with an output end of a (2j−1)-th stage of shift register unit, and an input end of a (2j+2)-th stage of shift register unit is connected with an output end of a (2j)-th stage of shift register unit, where j is a positive integer greater than or equal to 1.

A first control signal end of a (4i+1)-th stage of shift register unit is connected with the first clock signal end CLK1, a second control signal end thereof is connected with an output end of a (4i+2)-th stage of shift register unit, a fourth control signal end thereof is connected with an output end of a (4i+4)-th stage of shift register unit, and a sixth control signal end thereof is connected with the fourth clock signal end CLK2B, where i is an integer greater than or equal to 0.

A first control signal end of a (4i+2)-th stage of shift register unit is connected with the second clock signal end CLK2, a second control signal end thereof is connected with an output end of a (4i+3)-th stage of shift register unit, a fourth control signal thereof is connected with an output end of a (4i+5)-th stage of shift register unit, and a sixth control signal end thereof is connected with a first clock signal end CLK1.

A first control signal end of a (4i+3)-th stage of shift register unit is connected with the third clock signal end CLK1B, a second control signal end thereof is connected with an output end of a (4i+4)-th stage of shift register unit, a fourth control signal end thereof is connected with an output end of a (4i+6)-th stage of shift register unit, and a sixth control signal thereof is connected with the second clock signal end CLK2.

A first control signal end of a (4i+4)-th stage of shift register unit is connected with the fourth clock signal end CLK2B, a second control signal end thereof is connected with an output end of a (4i+5)-th stage of shift register unit, a fourth control signal end thereof is connected with an output end of a (4i+7)-th stage of shift register unit, and a sixth control signal end thereof is connected with the third clock signal end CLK1B.

Additionally, in the case of each shift register unit being the shift register unit as shown in FIG. 10. A fifth control signal end of the (2j−1)-th stage of shift register unit is connected with an output end of the (2j+1)-th stage of shift register unit, and a fifth control signal end of the (2j)-th stage of shift register unit is connected with an output end of the (2j+2)-th stage of shift register unit, where j is an integer greater than or equal to 1.

Additionally, in the case of each shift register unit being the shift register unit as shown in FIG. 11, a seventh control signal end of the (4i+1)-th stage of shift register unit is connected with the third clock signal end CLK1B, a seventh control signal end of the (4i+2)-th stage of shift register unit is connected with the fourth clock signal end CLK2B, a seventh control signal end of the (4i+3)-th stage of shift register unit is connected with the first clock signal end CLK1, and a seventh control signal end of the (4i+1)-th stage of shift register unit is connected with the second clock signal end CLK2, where i is an integer greater than or equal to 0.

Returning to FIG. 9, it also shows an output signal GL1 of a first stage of shift register unit, an output signal GL2 of a second stage of shift register unit, an output signal GL3 of a third stage of shift register unit, and an output signal GL4 of a fourth stage of shift register unit.

Operation of the shift register unit according to the second embodiment of the present disclosure will be described below by referring to FIGS. 13-17.

Figure 13:
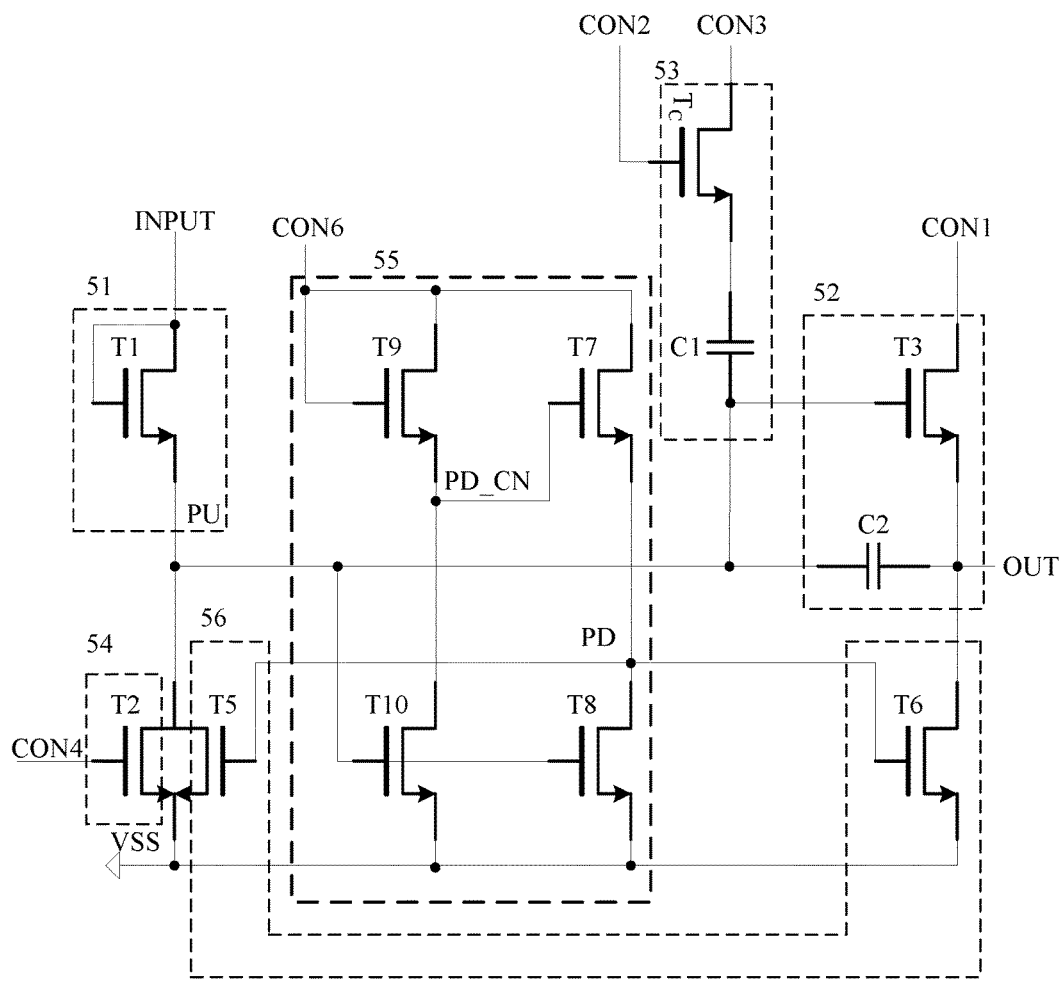
FIG. 13 shows an exemplary circuit implementation of the shift register unit according to the second embodiment of the present disclosure.

FIG. 13 shows an exemplary circuit implementation of the shift register unit according to the second embodiment of the present disclosure.

As shown in FIG. 13, the shift register unit according to the second embodiment of the present disclosure comprises an input module 51, an output module 52, a coupling module 53, a reset module 54, a pull-down control module 55 and a pull-down module 56.

Circuit structure of the input module 51, the output module 52, the reset module 54, the pull-down control module 55 and the pull-down module 56 in FIG. 13 is the same as the circuit structure of the input module 51, the output module 52, the reset module 54, the pull-down control module 55 and the pull-down module 56 in FIG. 8, and thus no further description is given herein.

As shown in FIG. 13, the coupling module 53 comprises a coupling transistor Tc and a first capacitor C1.

A gate of the coupling transistor Tc is connected with the second control signal end CON2, a first electrode thereof is connected with the third control signal end CON3. A first end of the first capacitor C1 is connected with a second electrode of the coupling transistor Tc, and a second end thereof is connected with the pull-up node PU.

Alternatively, the gate of the coupling transistor Tc can be connected with the third control signal end CON3, and the first electrode thereof can be connected with the second control signal end CON2.

According to the second embodiment of the present disclosure, in FIG. 13, for example, the first control signal end CON1 is connected with the first clock signal end CLK1, the first control signal is a first clock signal, and a period of the first clock signal is a first period. The second control signal of the second control signal end CON2 is prolonged ¼ of the first period than the output signal at the output end OUT. The third control signal of the third control signal end CON3 is a pulse signal. A period of the pulse signal is a second period, which is ½ of the first period, a duty ratio of the pulse signal is smaller than or equal to ½, and the third control signal is in effective control level at both the jump-up edge and the jump-down edge of the first control signal. The fourth control signal of the fourth control signal end CON4 is prolonged ¾ of the first period than the output signal at the output end. The sixth control signal of the sixth control signal end CONE is prolonged ¾ of the first period than the first control signal of the first control signal end CON1.

Figure 14:
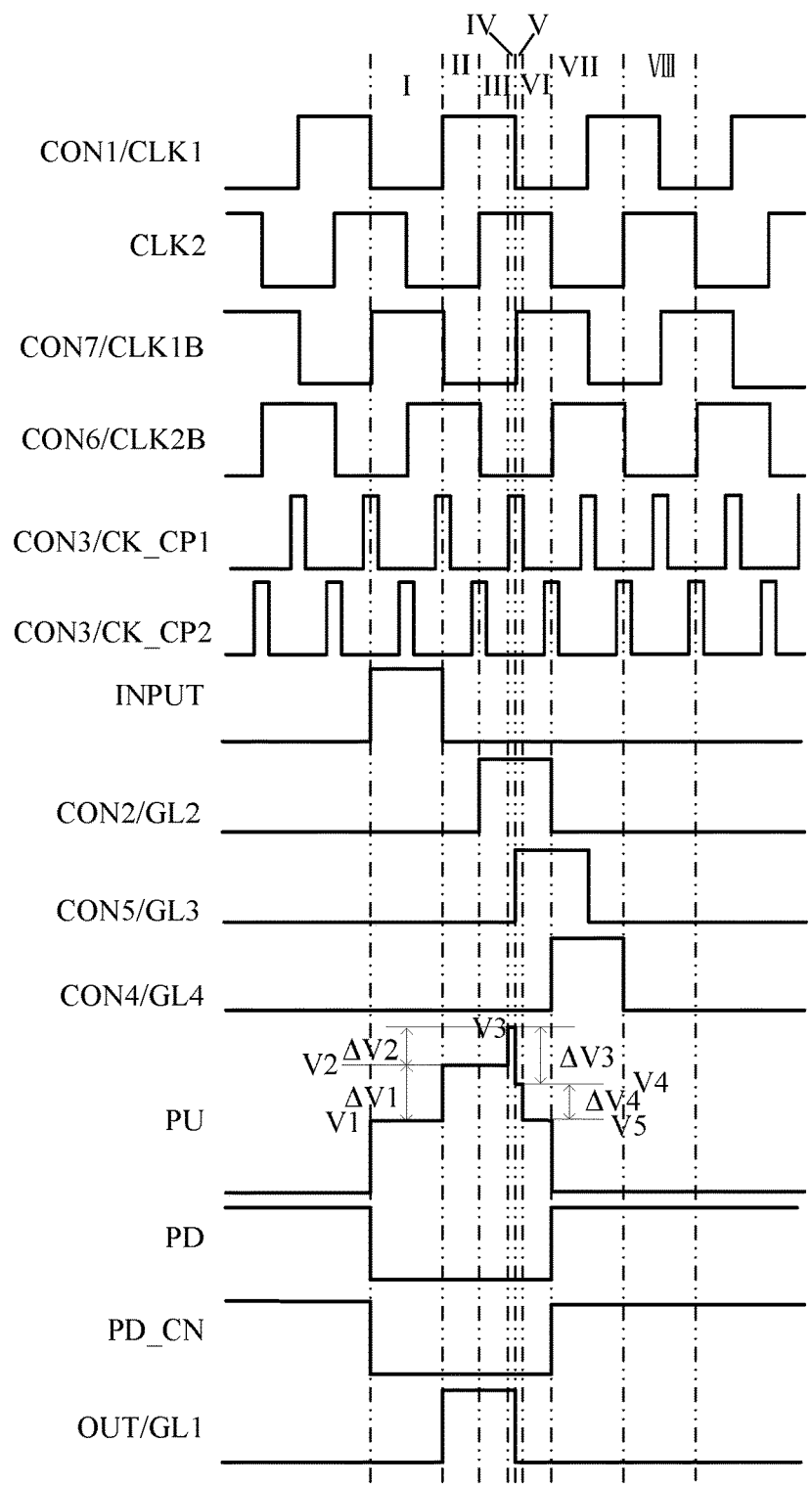
FIG. 14 shows an operation timing diagram of an exemplary circuit of the shift register unit according to the second embodiment of the present disclosure.

FIG. 14 shows an operation timing diagram of an exemplary circuit of the shift register unit according to the second embodiment of the present disclosure.

There are shown in FIG. 14 two control signals of the third control signal end CON3. Description below about the shift register unit as shown in FIG. 13 only uses a control signal CON3/CK_CP1, and another control signal CON3/CK_CP2 is used to a previous or next stage of shift register unit of a shift register unit described currently.

In a first phase I (input phase), the second control signal of the second control signal end CON2 is at the low level, and the coupling transistor Tc is turned off. Remaining operations in the first phase I are the same as the operations in the first phase I as shown in FIG. 9, and thus no further description is given herein. In the first phase I, the pull-up node is in the first high voltage V1.

In a second phase II (first output phase), the second control signal of the second control signal end CON2 is still at the low level, and the coupling transistor Tc maintains turned off Remaining operations in the second phase II are the same as the operations in the first phase I as shown in FIG. 9, and thus no further description is given herein. In the second phase II, the output end OUT outputs the high level, and due to the effect of voltage-coupling of the second capacitor C2, at this time the pull-up node PU is raised from the first high voltage V1 to the second high voltage V2.

In a third phase III (second output phase), the second control signal of the second control signal end CON2 is at the high level, the coupling transistor Tc is turned on, the third control signal end CON3 is at the low level, and at this time. the voltage of the pull-up node PU maintains in the second high voltage V2. Remaining operations in the third phase III are the same as the operations in the third phase III as shown in FIG. 9, and thus no further description is given herein.

In a fourth phase IV (third output phase), the second control signal of the second control signal end CON2 is at the high level, the coupling transistor Tc is turned on, the third control signal end CON3 jumps from the low level to the high level, and at this time the voltage of the pull-up nod PU is raised form the second high voltage V2 to the third high voltage V3. Remaining operations in the fourth phase IV are the same as the operations in the third phase III as shown in FIG. 9, and thus no further description is given herein.

In a fifth phase V (first reset phase), the second control signal of the second control signal end CON2 is still at the high level, the coupling transistor Tc maintains turned on, the third control signal end CON3 is still at the high level, the first control signal of the first control signal end CON1 jumps from the high level to the low level, and since the pull-up node PU is still at the high level, the output transistor T3 maintains turned on to pull down the output end OUT to the low level of the first control signal, and due to effect of voltage-coupling of the second capacitor C2, the pull-up node PU decreases from the third high voltage V3 to the fourth high voltage V4 at this time. Remaining operations in the fifth phase V are the same as the operations in the fourth phase IV as shown in FIG. 9, and thus no further description is given herein. In the fifth phase V, the pull-up node PU is in the fourth high voltage V4, and the output transistor T3 is turned on to pull down the output end OUT to the low level of the first control signal. It is apparent that the fourth high voltage V4 is higher than the first high voltage V1. Therefore, compared with the pull-up signal at the pull-up node PU in the third phase as shown in FIG. 4, the pull-up node PU in the fourth high voltage V4 makes the output transistor T3 be capable of resetting the output end OUT more quickly, thereby reducing the reset time of the output end OUT.

In a sixth phase (second reset phase), the second control signal of the second control signal end CON2 maintains at the high level, the coupling transistor Tc maintains turned on, the third control signal end CON3 jumps from the high level to the low level, and due to the effect of voltage-coupling of the first capacitor C1, the pull-up node PU decreases from the fourth high voltage V4 to the fifth high voltage V5. Remaining operations in the sixth phase VI are the same as operations in the fourth phase IV as shown in FIG. 9, and thus no further description is given herein. In the sixth phase VI, the pull-up node is at the fifth high voltage V5, the output transistor T3 is turned on to pull down the output end OUT to the low level of the first control signal.

In a seventh phase VII (third reset phase), the second control signal of the second control signal end CON2 is at the low level, and the coupling transistor Tc is turned off.

Remaining operations in the seventh phase VII are the same as operations in the fifth phase V as shown in FIG. 9, and thus no further description is given herein. In the seventh phase VII, the pull-up node PU is at the low level, and the pull-down node PD is at the high level.

In an eight phase VIII, the second control signal of the second control signal end CON2 is at the low level, and the coupling transistor Tc maintains turned off Remaining operations in the eighth phase VIII are the same as the operations in the sixth phase as shown in FIG. 9, and thus no further description is given herein. In the eighth phase VIII, the pull-up node PU maintains at the low level and the pull-down node PD maintains at the high level.

After that, during display of one frame image, the seventh phase VII and the eighth phase VIII are repeated until display of a next frame image starts, that is, an effective input signal is input again to the input end INPUT.

A voltage difference between the second high voltage V2 and the first high voltage V1 is Δ V1, a voltage difference between the third high voltage V3 and the second high voltage V2 is Δ V2, a voltage difference between the fourth high voltage V4 and the third high voltage V3 is Δ V3, and a voltage difference between the fourth high voltage V4 and the fifth high voltage V5 is Δ V4. The first high voltage V1, the second high voltage V2, the third high voltage V3, the fourth high voltage V4, and the fifth high voltage V5 are determined by a voltage value of the input signal at the input end INPUT, a voltage value of the first control signal of the first control signal end CON1, a voltage value of the third control signal of the third control signal end CON3, the first capacitor C1, the second capacitor C2 and a circuit parasitic capacitor.

As shown in FIG. 14, when the output end OUT starts to be pulled down, the pull-up signal at the pull-up node PU is at the third high voltage V3, and the third high voltage V3 is higher than the second high voltage V2 as shown in FIGS. 2 and 4. Therefore, the shift register unit according to the second embodiment of the present disclosure is capable of not only utilizing the output transistor T3 to realize resetting or pulling down of the output end OUT but also reducing the reset time of the output end OUT by further raising the pull-up signal at the pull-up node PU, which is helpful to enhance resolution of the display device and narrow the frame of the display device.

Figure 15:
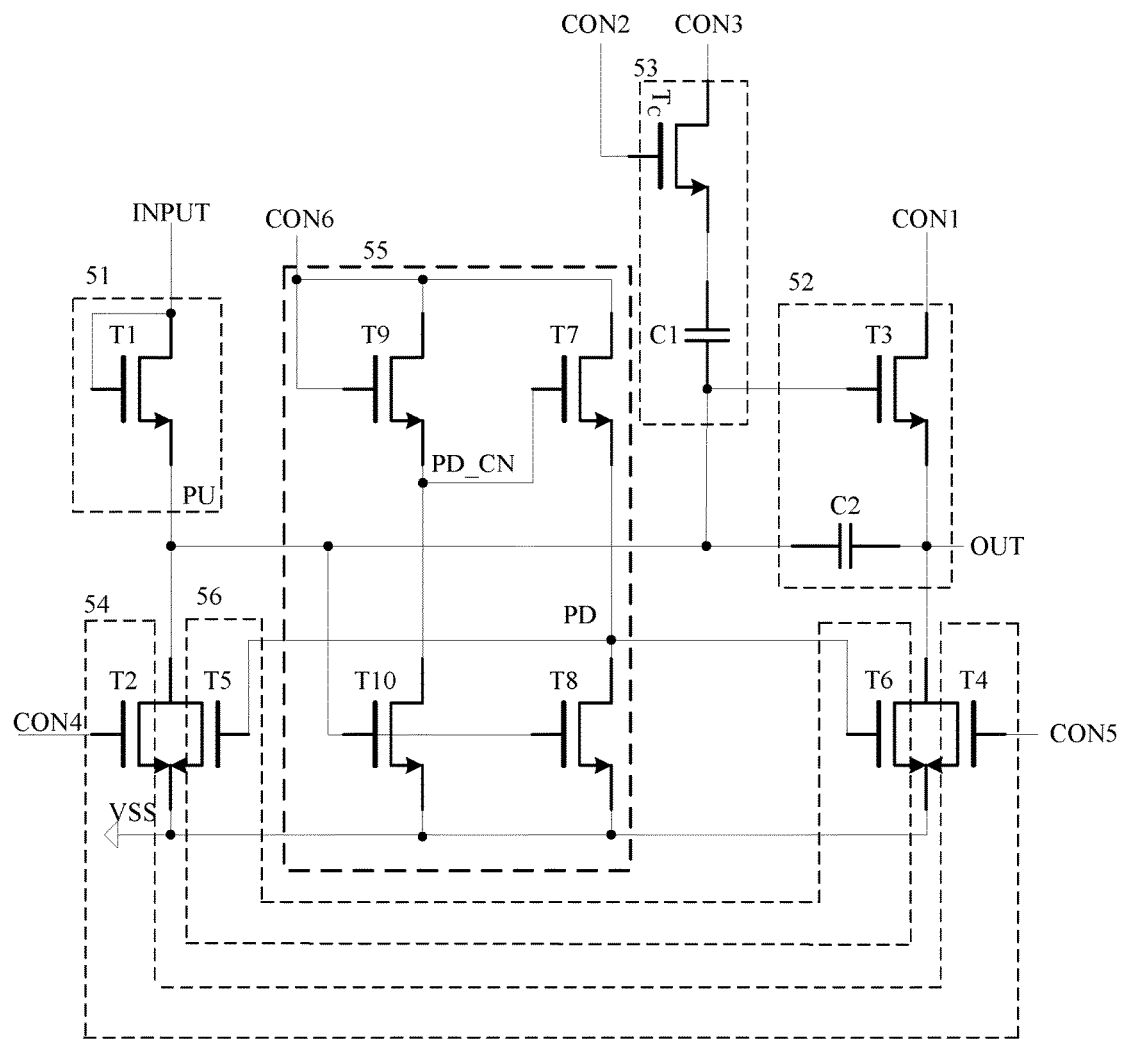
FIG. 15 shows another exemplary circuit implementation of the shift register unit according to the second embodiment of the present disclosure.

FIG. 15 shows another exemplary circuit implementation of the shift register unit according to the second embodiment of the present disclosure.

As shown in FIG. 15, the reset module 54 further comprises an output reset transistor T4. A connection manner of the output reset transistor T4 is the same as that in FIG. 11, and thus no further description is given herein.

In the fifth phase V and the sixth phase VI, the fifth control signal of the fifth control signal end CON5 is at the high level, and the output reset transistor T4 is turned on to pull down the output end OUT to the low power supply voltage of the low power supply voltage end VSS.

The driving capacity of the output end OUT can be enhanced by adding the reset transistor T4. The output end OUT can be pulled down to the low power supply voltage of the low power supply voltage end VSS faster by the cooperation of the output transistor T3 and the output reset transistor T4.

Figure 16:
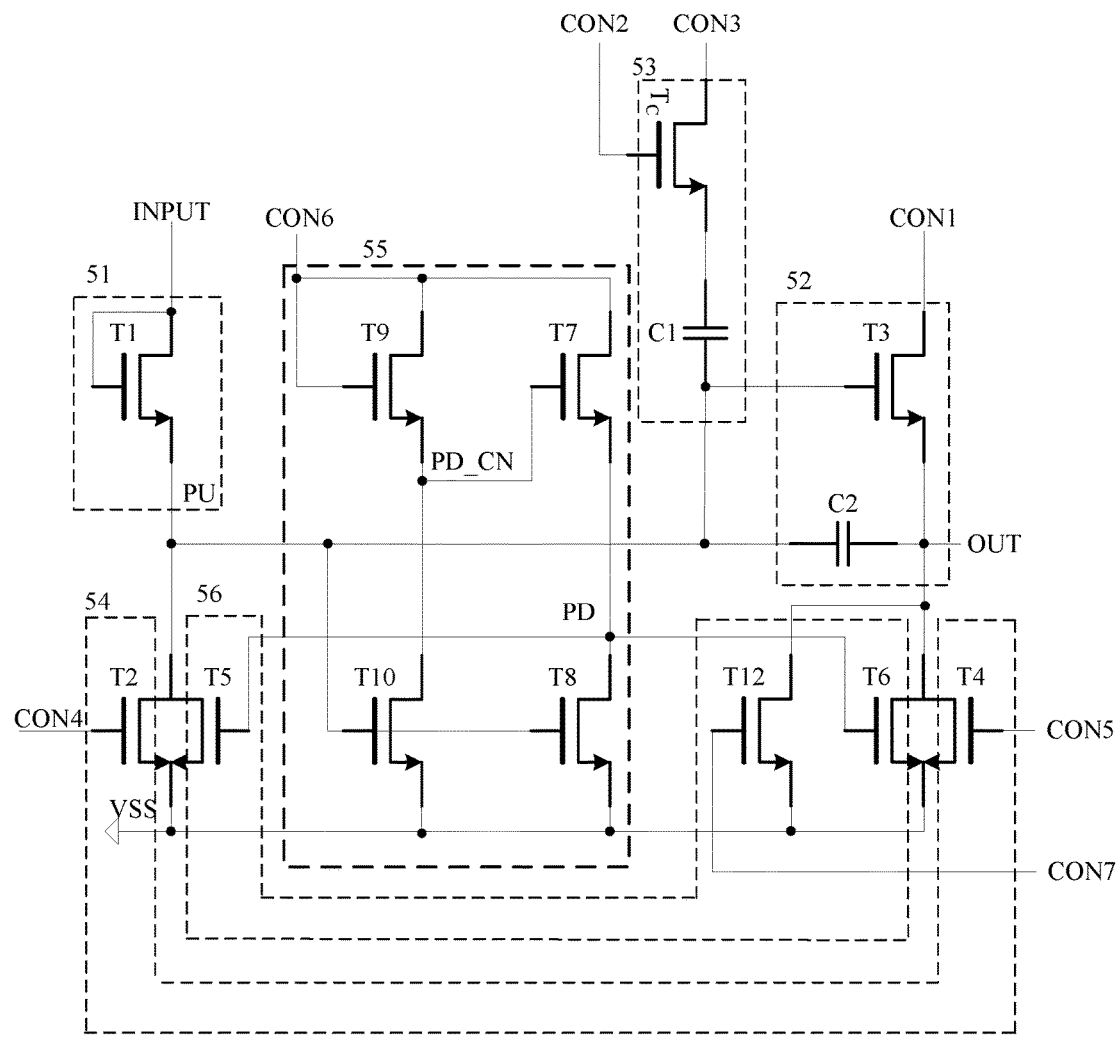
FIG. 16 shows yet another exemplary circuit implementation of the shift register unit according to the second embodiment of the present disclosure.

FIG. 16 shows yet another exemplary circuit implementation of the shift register unit according to the second embodiment of the present disclosure.

As shown in FIG. 16, the pull-down module 56 further comprises a clock pull-down transistor T11. Connection manner of the clock pull-down transistor T11 is the same as that as shown in FIG. 11, and thus no further description is given herein.

In the fifth phase V and the sixth phase V1, the seventh control signal of the seventh control signal end CONT is at the high level, the clock pull-down transistor T11 is turned on to pull down the output end OUT to the low power supply voltage of the low power supply voltage end VSS.

The driving capacity of the output end OUT can be enhanced by adding the clock pull-down transistor T11, and the output end OUT can be pulled down to the low power supply voltage of the low power supply voltage end VSS faster through cooperation of the output transistor T3 and the clock pull-down transistor T11.

Figure 17:
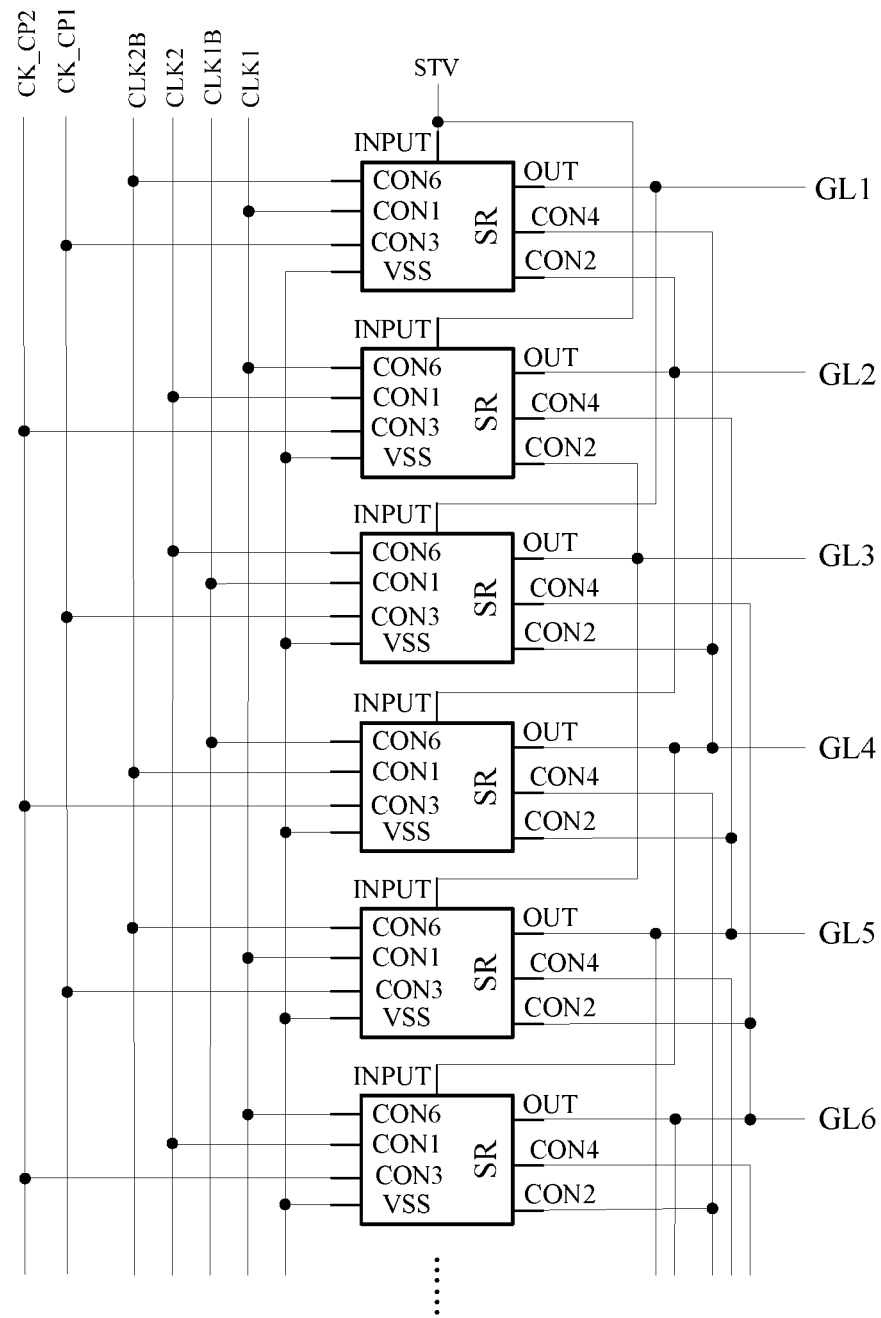
FIG. 17 shows a schematic block diagram of the shift register unit according to the second embodiment of the present disclosure.

FIG. 17 shows a schematic block diagram of the shift register unit according to the second embodiment of the present disclosure.

As shown in FIG. 17, the shift register according to the second embodiment of the present disclosure comprises multiple shift register units connected in cascades, each of which can be as shown in FIG. 13.

The shift register unit according to the second embodiment of the present disclosure is connected with a start input signal end STV, a first clock signal end CLK1, a second clock signal end CLK2, a third clock signal end CLK1B and a fourth clock signal end CLK2B, a first pulse signal end CK_CP2, and a second pulse signal end CK_CP2. Periods of a first clock signal at the first clock signal end CLK1, a second clock signal at the second clock signal end CLK2, a third clock signal at the third clock signal end and a fourth clock signal at the fourth clock signal end CLK2B are the first period, and the second clock signal is prolonged ¼ of the first period than the first clock signal, the third clock signal is prolonged ¼ of the first period than the second clock signal, and the fourth clock signal is prolonged ¼ of the first period than the third clock signal. Periods of a first pulse signal at the first pulse signal end CK_CP1 and a second pulse signal at the second pulse signal end CK_CP2 are second periods, and the second pulse signal is prolonged ½ of the second period than the first pulse signal, duty ratios of the first pulse signal and the second pulse signal are the same and smaller than or equal to ½, and the second period is ½ of the first period.

Input ends INPUT of first and second stages of shift register units are connected with an initial input signal end STV to receive an initial input signal, an input end of a (2j+1)-th stage of shift register unit is connected with an output end of a (2j−1)-th stage of shift register unit, and an input end of a (2j+2)-th stage of shift register unit is connected with an output end of a (2j)-th stage of shift register unit, where j is a positive integer greater than or equal to 1.

A first control signal end of a (4i+1)-th stage of shift register unit is connected with the first clock signal end CLK1, a second control signal end thereof is connected with an output end of a (4i+2)-th stage of shift register unit, a third control signal is connected with the first pulse signal end, and a fourth control signal end thereof is connected with an output end of a (4i+4)-th stage of shift register unit, and a sixth control signal end thereof is connected with the fourth clock signal end CLK2B, where i is an integer greater than or equal to 0.

A first control signal end of a (4i+2)-th stage of shift register unit is connected with the second clock signal end CLK2, a second control signal end thereof is connected with an output end of a (4i+3)-th stage of shift register unit, a fourth control signal thereof is connected with an output end of a (4i+5)-th stage of shift register unit, and a sixth control signal end thereof is connected with a first clock signal end CLK1.

A first control signal end of a (4i+3)-th stage of shift register unit is connected with the third clock signal end CLK1B, a second control signal end thereof is connected with an output end of a (4i+4)-th stage of shift register unit, a fourth control signal end thereof is connected with an output end of a (4i+6)-th stage of shift register unit, and a sixth control signal thereof is connected with the second clock signal end CLK2.

A first control signal end of a (4i+4)-th stage of shift register unit is connected with the fourth clock signal end CLK2B, a second control signal end thereof is connected with an output end of a (4i+5)-th stage of shift register unit, a fourth control signal end thereof is connected with an output end of a (4i+7)-th stage of shift register unit, and a sixth control signal end thereof is connected with the third clock signal end CLK1B.

Additionally, in the case of each shift register unit being the shift register unit as shown in FIG. 15. A fifth control signal end of the (2j−1)-th stage of shift register unit is connected with an output end of the (2j+1)-th stage of shift register unit, and a fifth control signal end of the (2j)-th stage of shift register unit is connected with an output end of the (2j+2)-th stage of shift register unit, where j is an integer greater than or equal to 1.

Additionally, in the case of each shift register unit being the shift register unit as shown in FIG. 16, a seventh control signal end of the (4i+1)-th stage of shift register unit is connected with the third clock signal end CLK1B, a seventh control signal end of the (4i+2)-th stage of shift register unit is connected with the fourth clock signal end CLK2B, a seventh control signal end of the (4i+3)-th stage of shift register unit is connected with the first clock signal end CLK1, and a seventh control signal end of the (4i+1)-th stage of shift register unit is connected with the second clock signal end CLK2, where i is an integer greater than or equal to 0.

Optionally, the above respective transistors are N type thin film transistors, and the first electrode can be a drain, the second electrode can be a source, the effective control level, the effective pull-up level and the effective pull-down level are the high level, the ineffective control level, the ineffective pull-up level and the ineffective pull-down level are the low level.

Alternatively, the respective transistors can be P type thin film transistors, and the first electrode can be a source, the second electrode can be a drain, the effective control level, the effective pull-up level and the effective pull-down level are the low level, and the ineffective control level, the ineffective pull-up level and the ineffective pull-down level are the high level.

Alternatively, the respective transistors can be any combination of the P type and N type thin film transistors.

By resetting the output end and the pull-up node in a time division manner and further pulling up the voltage of the pull-up node when the output end is being reset, the shift register unit and the operation method for the shift register unit, and the shift register according to the embodiments of the present disclosure can not only utilize the output transistor to realize resetting of the shift register unit but also enhance speed of resetting the output end by the output transistor, so that the reset time of the shift register unit is reduced, which is helpful to enhance resolution of the display device and narrow frame of the display device.

Respective embodiments of the present disclosure are described above in detail. However, those skilled in the art shall understand that various amendments, combinations or sub-combinations can be made to these embodiments without departing from the principle and spirit of the present disclosure, and such amendments shall fall into the scope of the present disclosure.

The present application claims the priority of a Chinese patent application No. 201510649786.4 filed on Oct. 9, 2015, with an invention title of "SHIFT REGISTER UNIT AND OPERATION METHOD FOR SHIFT REGISTER UNIT AND SHIFT REGISTER". Herein, the content disclosed by the Chinese patent application is incorporated in full by reference as a part of the present disclosure.

What is claimed is:

1. A shift register unit, comprising:
   an input module of which a first end is connected with an input end of the shift register unit to receive an input signal from the input end, and a second end is connected with a pull-up node, and configured to transmit a received input signal to the pull-up node;
   an output module of which a first end is connected with the pull-up node, a second end is connected with a first control signal end, and a third end is connected with an output end of the shift register unit, and configured to output a first control signal of the first control signal end to the output end when a pull-up signal at the pull-up node is in effective pull-up level;
   a coupling module of which a first end is connected with a second control signal end, and a second end is connected with the pull-up node, and configured to control the pull-up signal at the pull-up node according to a second control signal of the second control signal end by way of voltage coupling;
   the coupling module is configured to make the pull-up signal at the pull-up node jump from a first coupling voltage to a second coupling voltage by way of voltage-coupling when the second control signal of the second control signal end jumps from a first level to a second level,
   wherein a period of the first control signal is a first period, and the second control signal is prolonged ¼ of the first period than an output signal at the output end of the shift register unit.

2. The shift register unit according to claim 1, wherein the coupling module comprises:
   a first capacitor, whose first end is connected with the second control signal end and second end is connected with the pull-up node.

3. The shift register unit according to claim 1, wherein a third end of the coupling module is connected with a third control signal end, and the coupling module is configured to make the pull-up signal at the pull-up node jump from the first coupling voltage to the second coupling voltage by way of voltage-coupling when the second control signal of the second control signal end is in effective control level and a third control signal of the third control signal end jumps from the first level to the second level,
   wherein the period of the first control signal is the first period, and the second control signal is prolonged ¼ of the first period than the output signal at the output end of the shift register unit; a period of the third control signal is a second period, the second period is ½ of the first period, a duty ratio of the third control signal is smaller than or equal ½, and the third control signal is in effective control level at both a jump-up edge and a jump-down edge of the first control signal.

4. The shift register unit according to claim 3, wherein the coupling module comprises:
   a coupling transistor, whose gate is connected with the second control signal end, and first electrode is connected with a third control signal end; and
   a first capacitor, whose first end is connected with a second electrode of the coupling transistor, and second end is connected with the pull-up node.

5. The shift register unit according to claim 1, further comprising:
   a reset module, whose first end is connected with a fourth control signal end, second end is connected with the pull-up node, and third end is connected with a low power supply voltage end, and the reset module is configured to pull down the pull-up signal at the pull-up node to a low power supply voltage of the low power supply voltage end when a fourth control signal of the fourth control signal end is in effective control level,
   wherein the period of the first control signal is the first period, and
   the fourth control signals is prolonged ¾ of the first period than the output signal at the output end of the shift register unit.

6. The shift register unit according to claim 5, wherein a fourth end of the reset module is connected with a fifth control signal end, and a fifth end thereof is connected with the output end, and the reset module is further configured to pull down the output signal at the output end to the low power supply voltage of the low power supply voltage end when a fifth control signal of the fifth control signal end is in effective control level,
   wherein the fifth control signal is prolonged½ of the first period than the output signal at the output end of the shift register unit.

7. The shift register unit according to claim 6, wherein,
   the reset module comprises a node reset transistor and an output reset transistor,
   wherein a gate of the node reset transistor is connected with the fourth control signal end, a first electrode thereof is connected with the pull-up node, and a second electrode thereof is connected with the low power supply voltage end; and
   a gate of the output reset transistor is connected with the fifth transistor signal end, a first electrode thereof is connected with the output end, and a second electrode thereof is connected with the low power supply voltage end.

8. The shift register unit according to claim 5, further comprising:
   a pull-down control module, whose first end is connected with a sixth control signal, second end is connected with the pull-up node, and third end is connected with a pull-down mode, and the pull-down control module is configured to: a pull-down signal generated at the pull-down node is in ineffective pull-down level when the pull-up signal at the pull-up node is in effective pull-up level; and the pull-down signal generated at the pull-down node is in effective pull-down level when the pull-up signal at the pull-up node is in ineffective pull-up level and when the sixth control signal of the sixth control signal end is in effective control level; and
   a pull-down module of which a first end is connected with the pull-down node, a second end is connected with the output end, a third end is connected with the pull-up node, and a fourth end is connected with the low power supply voltage end, and configured to pull down the output end and the pull-up node to the low power supply voltage of the low power supply voltage end when the pull-down signal at the pull-down node is in effective pull-down level, wherein the sixth control signal is prolonged ¾ of the first period than the first control signal.

9. The shift register unit according to claim 8, wherein a fifth end of the pull-down module is connected with a seventh control signal end, and the pull-down module is further configured to pull down the output end to the low power supply voltage of the low power supply voltage end when a seventh control signal of the seventh control signal end is in effective control level, wherein the seventh control signal is prolonged ½ of the first period than the first control signal.

10. The shift register unit according to claim 9, wherein the pull-down control module comprises a first pull-down control transistor, a second pull-down control transistor, a third pull-down control transistor and a fourth pull-down control transistor; and the pull-down module comprises a node pull-down transistor and an output pull-down transistor; wherein a gate and a first electrode of the first pull-down control transistor is connected with the sixth control signal end, and a second electrode thereof is connected with a pull-down control node;

a gate of the second pull-down control transistor is connected with the pull-up node, a first electrode thereof is connected with the pull-down control node, and a second electrode thereof is connected with the low power supply voltage end;

a gate of the third pull-down control transistor is connected with the pull-down control node, a first electrode thereof is connected with the sixth control signal end, and a second electrode thereof is connected with the pull-down node;

a gate of the fourth pull-down control transistor is connected with the pull-up node, a first electrode thereof is connected with the pull-down node, and a second electrode thereof is connected o the low power supply voltage end; and gates of the node pull-down transistor and the output pull-down transistor are connected with the pull-down node and second electrodes thereof are connected with the low power supply voltage end, a first electrode of the node pull-down transistor is connected with the pull-up node, and a first electrode of the output pull-down transistor is connected with the output end.

11. The shift register unit according to claim 1, wherein, the input module comprises an input transistor, whose gate and first electrode is connected with the input end, and second electrode thereof is connected with the pull-up node; and the output module comprises an output transistor and a second capacitor, a gate of the output transistor and a first end of the second capacitor are connected with the pull-up node, a first electrode of the output transistor is connected with the first control signal end, and a second electrode of the output transistor and a second end of the second capacitor are connected with the output end.

12. An operation method for the shift register unit according to claim 1, comprising:

in the case of the output signal at the output end of the output module being at a high level, raising the pull-up signal at the pull-up node, by the coupling module, from a first pull-up voltage to a second pull-up voltage by way of voltage-coupling according to the second control signal of the second control signal end; and in the case of the first control signal of the first control signal end jumping from the high level into a low level, a pull-up signal of the second pull-up voltage at the pull-up node making the output module pull down the output end to the low level of the first control signal, wherein the output module outputs the first control signal to the output end when the pull-up signal at the pull-up node is in the first pull-up voltage and the second pull-up voltage.

13. The operation according to claim 12, wherein the shift register unit further comprises:

a reset module configured to pull down the pull-up signal at the pull-up node to a low power supply voltage of a low power supply voltage end when a fourth control signal of a fourth control signal end is in effective control level, wherein the fourth control signals is prolonged ¾ of the first period than the output signal at the output end of the shift register unit, the operation method comprises:

in a first output phase, the first control signal of the first control signal end is at the high level, the output module transmits a high voltage of the first control signal to the output end, such that the output signal at the output end is at the high level, the output module raises the pull-up signal at the pull-up node from a first voltage to a second voltage by utilizing an output voltage of the output end by way of voltage coupling, and the second voltage is the first pull-up voltage;

in a second output phase, the first control signal of the first control signal end is at the high level, the second control signal of the second control signal end is at the high level, the output end maintains at the high level, the coupling module raises the pull-up signal at the pull-up node from the second voltage to a third voltage by utilizing the high level of the second control signal by way of voltage coupling, and the third voltage is the second pull-up voltage;

in a first reset phase, the first control signal of the first control signal end jumps from the high level to the low level, a pull-up signal of the third voltage of the pull-up node makes the output module pull down the output end to the low level of the first control signal, such that the output signal at the output end is at the low level, and the output module decreases the pull-up signal at the pull-up node from the third voltage to a fourth voltage by utilizing the output voltage of the output end by way of voltage coupling;

in a second reset phase, the second control signal of the second control signal end jumps from the high level to the low level, and the fourth control signal of the fourth control signal end jumps from the low level to the high level, the coupling module makes the pull-up signal at the pull-up node decrease by utilizing the low level of the second control signal by way of voltage coupling, and the reset module pulls down the pull-up node to the low level of the low power supply voltage end, wherein the output module outputs the first control signal end to the output end when the pull-up signal at the pull-up node is in the first voltage, the second voltage, the third voltage and the fourth voltage.

14. The operation method according to claim 12, wherein the shift register unit further comprises:

a reset module configured to pull down the pull-up signal at the pull-up node to the low power supply voltage of the low power supply voltage end when a fourth control signal of a fourth control signal end is in effective control level, wherein the fourth control signal is prolonged ¾ of the first period than the output signal at the output end of the shift register unit, the operation method comprises:

in a first output phase, the first control signal of the first control signal end is at the high level, the output signal at the output end is at the high level, the output module raises the pull-up signal at the pull-up node from the first voltage to the second voltage by utilizing the high level of the output end by way of voltage coupling, and the second voltage is the first pull-up voltage;

in a second output phase, the first control signal of the first control signal end is at the high level, the second control signal of the second control signal end is at the high level, the third control signal of the third control signal end is at the low level, the output end maintains at the high level, and the pull-up node maintains the second voltage;

in a third output phase, the first control signal of the first control signal end is at the high level, the second control signal of the second control signal end is at the high level, the third control signal of the third control signal end jumps from the low level to the high level, the output end maintains at the high level, the coupling module raises the pull-up signal at the pull-up node from the second voltage to the third voltage by utilizing the high level of the third control signal by way of voltage coupling, and the third voltage is the second pull-up voltage;

in a first reset phase, the first control signal of the first control signal end jumps from the high level to the low level, a pull-up signal of the third voltage of the pull-up node makes the output module pull down the output end to the low level of the first control signal, such that the output signal at the output end is at the low level, and the output module decreases the pull-up signal at the pull-up node from the third voltage to the fourth voltage by utilizing an output voltage of the output end by way of voltage coupling;

in a second reset phase, the third control signal of the third control signal end jumps from the high level to the low level, and the coupling module makes the pull-up signal at the pull-up node decrease by utilizing the low level of the third control signal by way of voltage coupling;

in a third reset phase, the fourth control signal of the fourth control signal end jumps from the low level to the high level, and the reset module pulls down the pull-up node to the low level of the low power supply voltage end, wherein the output module outputs the first control signal end to the output end when the pull-up signal at the pull-up node is in the first voltage, the second voltage, the third voltage, the fourth voltage and the fifth voltage.

15. A shift register, comprising multiple shift register units connected in cascades according to claim 1, wherein input ends of first and second stages of shift register units receive an initial input signal, an input end of a (2j+1)-th stage of shift register unit is connected with an output end of a (2j−1)-th stage of shift register unit, and an input end of a (2j+2)-th stage of shift register unit is connected with an output end of a 2j-th stage of shift register unit, where j is an integer greater than or equal to 1;

a first control signal end of a (4i+1)-th stage of shift register unit is connected with a first clock signal end, and a second control signal end thereof is connected with an output end of a (4i+2)-th stage of shift register unit, where i is an integer greater than or equal to 0;

a first control signal end of the (4i+2)-th stage of shift register unit is connected with a second clock signal end, and a second control signal end thereof is connected with an output end of a (4i+3)-th stage of shift register unit;

a first control signal end of the (4i+3)-th stage of shift register unit is connected with a third clock signal end, and a second control signal end thereof is connected with an output end of a (4i+4)-th stage of shift register unit;

a first control signal end of the (4i+4)-th stage of shift register unit is connected with a fourth clock signal end, and a second control signal end thereof is connected with an output end of a (4i+5)-th stage of shift register unit, wherein periods of a first clock signal at the first clock signal end, a second clock signal at the second clock signal end, a third clock signal at the third clock signal end, and a fourth clock signal at the fourth clock signal end are a first period, and the second clock signal is prolonged ¼ of the first period than the first clock signal, the third clock signal is prolonged ¼ of the first period than the second clock signal, and the fourth clock signal is prolonged ¼ of the first period than the third clock signal.

16. The shift register according to claim 15, wherein the coupling module comprises: a first capacitor, whose first end is connected with the second control signal end and second end is connected with the pull-up node.

17. The shift register according to claim 15, wherein the coupling module comprises: a coupling transistor, whose gate is connected with the second control signal end and first electrode is connected with the third control signal end; and the first capacitor, whose first end is connected with a second electrode of the coupling transistor, and second end is connected with the pull-up node, wherein a third control signal end of the (2j−1)-th stage of shift register unit is connected with a first pulse signal end; a third control signal end of the 2j-th stage of shift register unit is connected with a second pulse signal end, wherein periods of a first pulse signal at the first pulse signal end and a second pulse signal at the second pulse signal end is a second period, and the second pulse signal is prolonged ½ of the second period than the first pulse signal, duty ratios of the first pulse signal and the second pulse signal are the same and smaller than or equal to ½, and the second period is ½ of the first period.

18. The shift register according to claim 15, wherein each shift register unit further comprises: a reset module configured to pull down a pull-up signal at a pull-up node to a low power supply voltage of a low power supply voltage end when a fourth control signal of a fourth control signal end is in effective control level, wherein a fourth control signal end of the (4i+1)-th stage of shift register unit is connected with an output end of the (4i+4)-th stage of shift register unit; a fourth control signal end of the (4i+2)-th stage of shift register unit is connected with an output end of the (4i+5)-th stage of shift register unit; a fourth control signal end of the (4i+3)-th stage of shift register unit is connected with an output end of a (4i+6)-th stage of shift register unit; and a fourth control signal of the (4i+4)-th stage of shift register unit is connected with an output end of a (4i+7)-th stage of shift register unit.

19. The shift register according to claim 15, wherein each shift register unit further comprises:
- a pull-down control module configured to: a pull-down signal generated at a pull-down node is in ineffective pull-down level when the pull-up signal at the pull-up node is an effective pull-up level; the pull-down signal generated at the pull-down node is in effective pull-down level when the pull-up signal at the pull-up node is in ineffective pull-up level and when a sixth control signal of a sixth control signal end is in effective control level;
- a pull-down module configured to pull down the output end and the pull-up node to the low power supply voltage of the low power supply voltage end when the pull-down signal at the pull-down node is in effective pull-down level,
- wherein a sixth control signal end of the (4i+1)-th stage of shift register unit is connected with the fourth clock signal end; a sixth control signal end of the (4i+2)-th stage of shift register unit is connected with the first clock signal end; a sixth control signal end of the (4i+3)-th stage of shift register unit is connected with the second clock signal end; and a sixth control signal end of the (4i+4)-th stage of shift register unit is connected with the third clock signal end.

\* \* \* \* \*